(12) United States Patent
Tsubata et al.

(10) Patent No.: US 7,868,960 B2
(45) Date of Patent: Jan. 11, 2011

(54) ACTIVE MATRIX SUBSTRATE, DISPLAY DEVICE, AND TELEVISION RECEIVER

(75) Inventors: Toshihide Tsubata, Tsu (JP); Yoshihiro Okada, Minamiashigara (JP)

(73) Assignee: Sharp Kabushiki Kaisha, Osaka (JP)

( * ) Notice: Subject to any disclaimer, the term of this patent is extended or adjusted under 35 U.S.C. 154(b) by 348 days.

(21) Appl. No.: 12/097,595

(22) PCT Filed: Oct. 24, 2006

(86) PCT No.: PCT/JP2006/321118

§ 371 (c)(1),
(2), (4) Date: Jun. 16, 2008

(87) PCT Pub. No.: WO2007/097068

PCT Pub. Date: Aug. 30, 2007

(65) Prior Publication Data

US 2009/0261338 A1 Oct. 22, 2009

(30) Foreign Application Priority Data

Feb. 24, 2006 (JP) .............................. 2006-049366

(51) Int. Cl.
*G02F 1/00* (2006.01)

(52) U.S. Cl. ............................ 349/43; 257/72; 257/390; 257/59; 257/E29.116; 257/E29.112; 257/E29.122; 349/46

(58) Field of Classification Search ....................... None
See application file for complete search history.

(56) References Cited

U.S. PATENT DOCUMENTS 5,380,555 A 1/1995 Mine et al.
5,767,929 A 6/1998 Yachi et al.

FOREIGN PATENT DOCUMENTS

EP 1788425 A1 * 5/2007

(Continued)

OTHER PUBLICATIONS

Official Communication issued in International Patent Application No. PCT/JP2006/321118, mailed on Dec. 5, 2006.

(Continued)

*Primary Examiner*—Sue Purvis
*Assistant Examiner*—Fei Fei Yeung Lopez
(74) *Attorney, Agent, or Firm*—Keating & Bennett, LLP

(57) ABSTRACT

An active matrix substrate includes a plurality of transistors. A source electrode is connected with a data signal line, and a drain electrode is connected with a pixel electrode in each transistor. The source electrode is located on a semiconductor layer, and at least a portion of the drain electrode is overlapped with the gate electrode. A gate insulating film covering the gate electrode of each transistor has a thin section having a reduced film thickness, at a portion where the gate insulating film is overlapped with each gate electrode. An overlapping area of the thin section with the source electrode is smaller than an overlapping area of the thin section with the drain electrode. Thus, the active matrix substrate can prevent the generation of short-circuits between the signal lines (between the data signal line and a scanning signal line) in a TFT forming region, while guaranteeing TFT characteristics.

22 Claims, 14 Drawing Sheets

FOREIGN PATENT DOCUMENTS

| | | |
|---|---|---|
| JP | 61-225869 A | 10/1986 |
| JP | 01-234831 A | 9/1989 |
| JP | 01-300567 A | 12/1989 |
| JP | 03-050526 A | 3/1991 |
| JP | 03-051819 A | 3/1991 |
| JP | 05-203986 A | 8/1993 |
| JP | 06-112485 A | 4/1994 |
| JP | 07-028087 A | 1/1995 |
| JP | 07-114044 A | 5/1995 |
| JP | 08-328038 A | 12/1996 |
| JP | 10-102003 A | 4/1998 |
| JP | 11-015024 A | 1/1999 |
| JP | 11-119253 A | 4/1999 |
| JP | 2001-098224 A | 4/2001 |
| JP | 2005-038895 A | 2/2005 |
| JP | 2005-228805 A | 8/2005 |

OTHER PUBLICATIONS

Choi et al.: "Performance of TFT Passivated With Low-K Dielectrics," Information Display Workshops (IDW); 2003; pg. 617-620.

* cited by examiner

F I G. 7
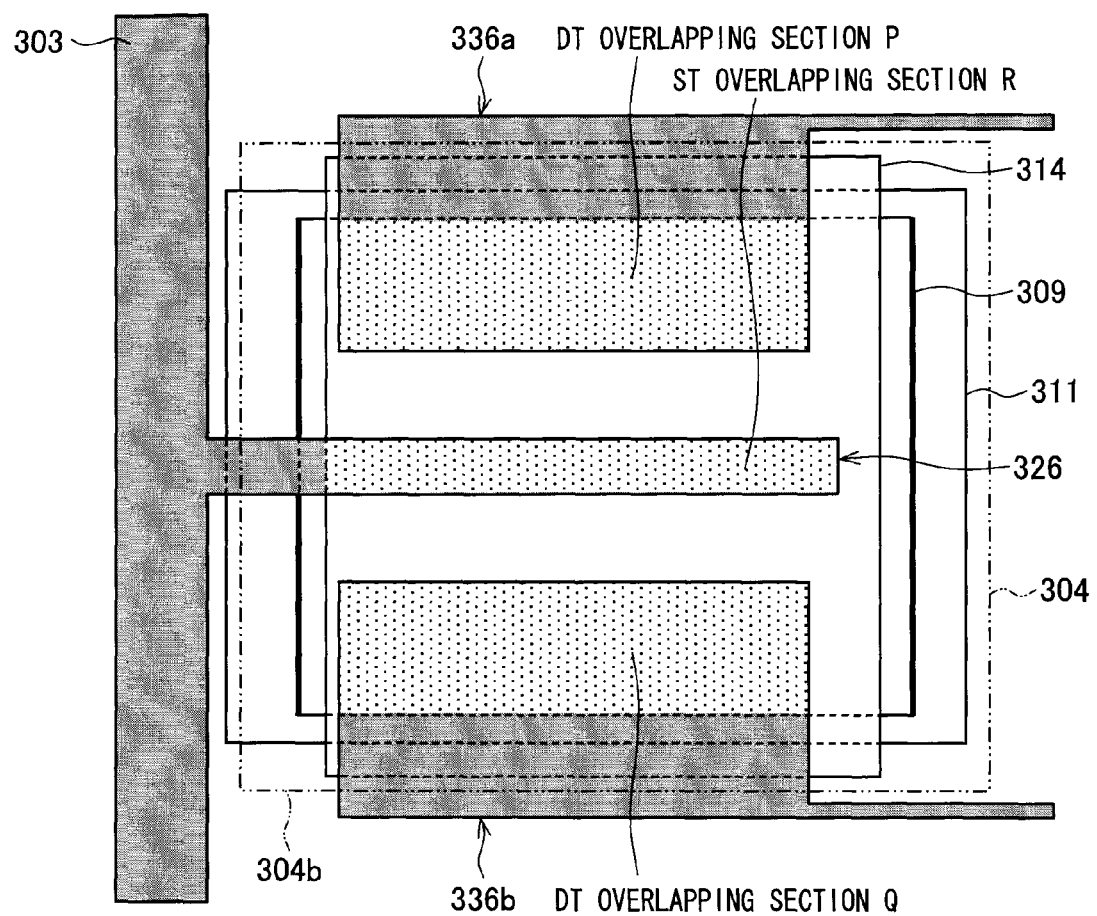

ACTIVE MATRIX SUBSTRATE, DISPLAY DEVICE, AND TELEVISION RECEIVER

BACKGROUND OF THE INVENTION

1. Field of the Invention

The present invention relates to an active matrix substrate which is used for a liquid crystal display device or the like.

2. Description of the Related Art

An active matrix substrate is widely used for active matrix display devices such as a liquid crystal display device and an EL (Electro Luminescence) display device. In an active matrix substrate which is used for a conventional active matrix liquid crystal display device, switching elements such as a TFT (thin film transistor) are provided at each of intersections of a plurality of scanning signal lines and a plurality of data signal lines, which scanning signal lines and data signal lines are provided crosswise on the substrate. According to a switching function of such a TFT or the like, image signals are appropriately transmitted to each of pixel (electrode) sections which are connected to the TFT or the like. In some active matrix substrates, a retention capacitor element is provided at each of the pixel sections in order that self-electric discharge of a liquid crystal layer which is caused while the TFT or the like is turned off or degradation of image signals because of off-current of the TFT or the like is prevented, or the retention capacitor element is used as an application path or the like for various modulating signals for driving a liquid crystal.

FIG. 17 illustrates an arrangement of a conventional active matrix substrate which is used in a liquid crystal display device. As illustrated in FIG. 17, an active matrix substrate 900 includes: a plurality of scanning signal lines 916; a plurality of data signal lines 915, which are arranged crosswise relative to the scanning signal lines 916; a TFT 912 (Thin Film Transistor) which is provided in the vicinity of an intersection of signal lines (915 and 916); and a pixel electrode 917. The TFT 912 includes: a gate electrode, which is a part of the scanning signal line 916; a source electrode 919, which is connected to the data signal line 915; and a drain electrode 908, which is connected to the pixel electrode 917 via a drain lead electrode 907. An insulating film provided between the drain lead electrode and the pixel electrode 917 has a hole, where a contact hole 910 is formed so as to connect the drain lead electrode 907 to the pixel electrode 917. The pixel electrode 917 is a transparent electrode such as an ITO, and light (back light) from a bottom of the active matrix substrate passes therethrough.

In this active matrix substrate 900, the TFT 912 is tuned on by scanning signals (gate on voltage) transmitted to the scanning signal line 916 (where the source electrode 919 is electrically connected to the drain electrode 908), and in this status, data signals (signal voltage) transmitted to the data signal line 915 are input in the pixel electrode 917 via the source electrode 919, the drain electrode 908, and the drain lead electrode 907.

An arrangement of the TFT 912 is as follows. The scanning signal line 916 (a gate electrode) is provided on a transparent insulating substrate, and a gate insulating film is arranged so as to cover the gate electrode. Moreover, a semiconductor layer is arranged on the gate insulating film so as to be overlapped with the gate electrode, and the source electrode 919 and the drain electrode 908 are arranged so as to cover a portion of the semiconductor layer.

However, in such a case where the gate insulating film is single-layered, structural defects such as a pinhole or a crack in the gate insulating film in a TFT forming region would cause a defect such as short-circuits between each of the electrodes in the TFT (short-circuits between the gate and the drain and short-circuits between the gate and the source). In order to avoid such a situation, an arrangement in which a gate insulating film is double-layered is proposed (for example, see Japanese Unexamined Patent Publication, Tokukaihei, No. 7-114044).

In such a case where the gate insulating film is double-layered, the gate insulating film between a gate electrode and a semiconductor layer becomes thick. This causes a problem such as degradation of TFT characteristics.

As a method for avoiding such a problem, Japanese Unexamined Patent Publication, Tokukaihei, No. 6-112485 discloses an arrangement in which a gate insulating layer below a semiconductor layer has a single-layer structure (a silicon nitride film), and in other parts, a gate insulating layer is provided to be a multilayer structure (a silicon oxide film and a silicon nitride film).

However, when the gate insulating layer in a TFT forming region has the single-layer structure, the gate insulating film between a source electrode and a gate electrode is thin. This may easily cause short-circuits between the source electrode and the gate electrode because of imperfect formation or the like of the gate insulating film as described above. The short-circuits between the source electrode and the gate electrode causes short-circuits between a data signal line and a scanning signal line. This is a serious defect which cannot be easily corrected.

SUMMARY OF THE INVENTION

In order to overcome the problems described above, preferred embodiments of the present invention provide an active matrix substrate which can suppress generation of short-circuits between signal lines (between a data signal line and a scanning signal line) in a TFT forming region while TFT characteristics are maintained.

An active matrix substrate according to a preferred embodiment of the present invention includes a plurality of transistors, each of which includes: a source electrode connected to a data signal line; and a drain electrode connected to a pixel electrode, wherein the source electrode is located on a semiconductor layer, at least a portion of the source electrode is overlapped with a gate electrode, the drain electrode is located on the semiconductor layer, at least a portion of the drain electrode is overlapped with the gate electrode, a gate insulating film covering the gate electrodes of each transistor includes a thin section having a reduced film thickness at each portion which is overlapped with each gate electrode, and an overlapping area of the thin section with the source electrode is smaller than an overlapping area of the thin section with the drain electrode. To put it differently, the active matrix substrate according to a preferred embodiment of the present invention includes a plurality of transistors, each of including a source electrode thereof connected to a data signal line; a drain electrode thereof connected to a pixel electrode; and a gate electrode thereof, which is connected to a scanning signal line, or alternatively is the scanning signal line being used as a gate electrode, the active matrix substrate including a gate insulating film covering the gate electrodes of each of the transistors and including a thin section having a reduced film thickness at each portion which is overlapped with each gate electrode, the thin section being arranged such that its overlapping area with the source electrode is small than its overlapping area with the drain electrode.

In this arrangement, a thin section overlapped with each gate electrode is provided in the gate insulating film, thereby resulting in the characteristics of the transistor being maintained. Meanwhile, the overlapping area of the thin section with the source electrode is smaller than the overlapping area of the thin section with the drain electrode, thereby resulting in the short-circuits between the gate electrode and the source electrode being prevented. With this arrangement, while characteristics of a transistor are maintained, it is possible to prevent the occurrence of short-circuits between signal lines (between a data signal line and a scanning signal line), which is difficult to be repaired.

The active matrix substrate according to a preferred embodiment of the present invention may be arranged such that the gate insulating film includes a plurality of gate insulating layers, wherein the thin section includes one or more gate insulating layers, and a portion other than the thin section includes more gate insulating layers than the thin section. In such a case, it is preferable that at least one of the gate insulating layers be a planarizing film. This arrangement reduces unevenness at an intersection of the scanning signal line and the data signal line, so that a number of steps where the data signal line crosses the scanning signal line is reduced, with the result that break of the data signal line at the intersection thereof with the signal lines hardly occurs. Moreover, for example, in a case where a SiNx (silicon nitride) film is used as one of the gate insulating layers, accuracy of the gate electrode in a tapering section becomes lower than that in other region (quality of the film degrades), and damage to the SiNx film because of static electricity is easily caused. On this account, if such a planarizing film is used as any one of a plurality of the gate insulating layers, then a certain thickness of the insulating film at the tapering section can be assured, with the result that damage to the SiNx film can be prevented.

Moreover, it is preferable that a bottom gate insulating layer be a planarizing film in the portion other than the thin section. Furthermore, it is preferable that a portion of the planarizing film which portion comes into contact with a surface of the substrate be thicker than the gate electrode provided on the surface of the substrate. This makes it possible to improve a planarizing effect and further prevent the occurrence of short-circuits between each of the signal lines. In addition, breaking of the data signal line is even more reliably prevented and minimized.

The gate insulating film may include a gate insulating layer including an organic material. Examples of a material including an organic material encompass a SOG (spin-on-glass) material, an acrylic resin material, an epoxy resin, a polyimide resin, a polyurethane resin, a polysiloxane resin, a novolac resin. Since a film can be formed by applying these materials to a substrate, such a film can be comparatively easily provided to be thick in a micron order. On this account, it is possible to provide large distance between a conductive layer connected to the scanning signal line or a retention capacitance wiring and other wirings. In addition, this makes it possible to hardly cause short-circuits.

It is preferable that the bottom gate insulating layer be a planarizing film (a SOG film) made of a spin-on-glass (SOG) material. This makes it possible to deposit successively a second insulating layer, a high-resistance semiconductor layer, and a low-resistance semiconductor layer on the SOG film as a first gate insulating layer by a CVD method or the like. This allows its production process to be shortened. In this case, the gate insulating film can be arranged such that the SOG film is not provided in the thin section, and is provided as a bottom layer in the portion other than the thin section. If the gate insulating film has such a shape that, a portion thereof adjacent to edges of the thin section has a forward tapered shape, then each of electrodes which are provided on the gate insulating film is hardly broken.

The active matrix substrate can be also arranged such that the thin section includes a linear edge, the drain electrode includes an extending section extending toward a direction of the edge and a connection section extending from the extending section away from the source electrode, the connection section is overlapped with the edge, and a width of the connection section in the direction of the edge direction is narrower than a width of the extending section in the direction of the edge. The drain electrode can be arranged to include a first and a second drain electrode which are respectively provided at each side of the source electrode. In this arrangement, it is possible to prevent changes in the overlapping area of the drain electrode with the thin section even when the drain electrode is not provided at an appropriate position, and changes in Cgd (parasitic capacitance between the gate electrode and the drain electrode). This allows reduction in unevenness of drain lead voltage while the transistor is off, and improvement in display quality of a display device in which the active matrix substrate is used.

It is preferable that the active matrix substrate be arranged such that a portion of the edge of the thin section is located outside an outer circumference of the semiconductor layer. When viewed perspectively, in a case where the thin section is placed fully inside the edge of the semiconductor layer, when the transistor is off, leak current between the source and the drain via the edge section of the semiconductor layer (off-leak current between the source and the drain which flows in a portion other than a channel region) easily flows. This is because off voltage is not sufficiently applied to an upper layer of the semiconductor region in a thick portion of the gate insulating film. For this reason, if a portion of the edge of the thin section is arranged to be located outside the outer circumference of the semiconductor layer, then it is possible to prevent such a leak current via the edge of the semiconductor layer. This allows improvement in an OFF characteristic of the transistor.

The active matrix substrate may include first and second transistors, and first and second pixel electrode in each pixel region, the first and second transistors including a source electrode in common, the source electrode being connected to a data signal line, the first transistor including a first gate electrode and a first drain electrode, the second transistor including a second gate electrode and a second drain electrode, the first and second gate electrodes being a portion of a scanning signal line or being extended from the scanning signal line, the first drain electrode being connected to the first pixel electrode while the second drain electrode is connected to the second pixel electrode, the source electrode being on the semiconductor layer, and at least a portion thereof being overlapped with the first and second gate electrodes, the first drain electrode being on the semiconductor layer, and at least a portion thereof being overlapped with the first gate electrode, the second drain electrode being on the semiconductor layer, and at least a portion thereof being overlapped with the second gate electrode, a gate insulating film covering each of the gate electrodes and including a first thin section having a reduced film thickness at a portion which is overlapped with the first gate insulating film, and a second thin section having a reduced film thickness at a portion which is overlapped with the second gate electrode, each of the thin sections being arranged such that an overlapping area of the first thin section with the source electrode is smaller than an overlapping area of the first thin section with the first drain electrode, and an overlapping area of the second thin section with the source electrode is smaller than an overlapping area of the second thin section with the second drain electrode.

In this case, the active matrix substrate can be also arranged such that the source electrode includes first and second source electrode, an overlapping area of the first thin section with the first source electrode is smaller than the overlapping area of the first thin section with the first drain electrode, and an overlapping area of the second thin section with the second source electrode is smaller than the overlapping area of the second thin section with the second drain electrode.

This arrangement is called a multi-pixel structure in which a plurality of regions having different brightnesses can be provided within one pixel. In this structure, if each of the overlapping areas of each thin section with each source electrode is smaller than each of the overlapping areas of each thin section with each drain electrode, then it is possible to prevent short-circuits between the gate electrode and the source electrode.

It is preferable that a hollow section where no electrode is provided be provided in the scanning signal line at an intersection thereof with the data signal line. In this case, it is preferable that the hollow section extend in the scanning signal line direction, and the first and second gate electrodes be respectively provided at each side of the hollow section.

With this arrangement, even if short-circuits in each of the signal lines (the scanning signal line and the data signal line) occurs, the data signal line passing through above the hollow section can be easily cut out by laser or the like. That is, if a portion including the short-circuit defects in the cut out data signal line is separated, then it is possible to thoroughly separate a transistor including that short-circuit defects. Then, a repair by using an auxiliary wiring or the like is performed as needed, thereby resulting in the active matrix substrate working properly except for a pixel electrode connected to the defective transistor. This allows improvement in its manufacturing yield.

A display device according to another preferred embodiment of the present invention includes the active matrix substrate according to preferred embodiments described above.

A television receiver according to a further preferred embodiment of the present invention includes the display device and a tuner section for receiving a television broadcast.

As has been already described, according to the active matrix substrate of preferred embodiments of the present invention, it is possible to prevent the occurrence of short-circuits between signal lines (between the data signal line and the scanning signal line) which are not easy to repair while maintaining properties of the transistor.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 7 is a plan view illustrating an exemplary arrangement of the active matrix substrate.

DETAILED DESCRIPTION OF THE PREFERRED EMBODIMENTS

Preferred embodiments of the present invention are described below with reference to FIGS. 1 through 16.

Figure 1:
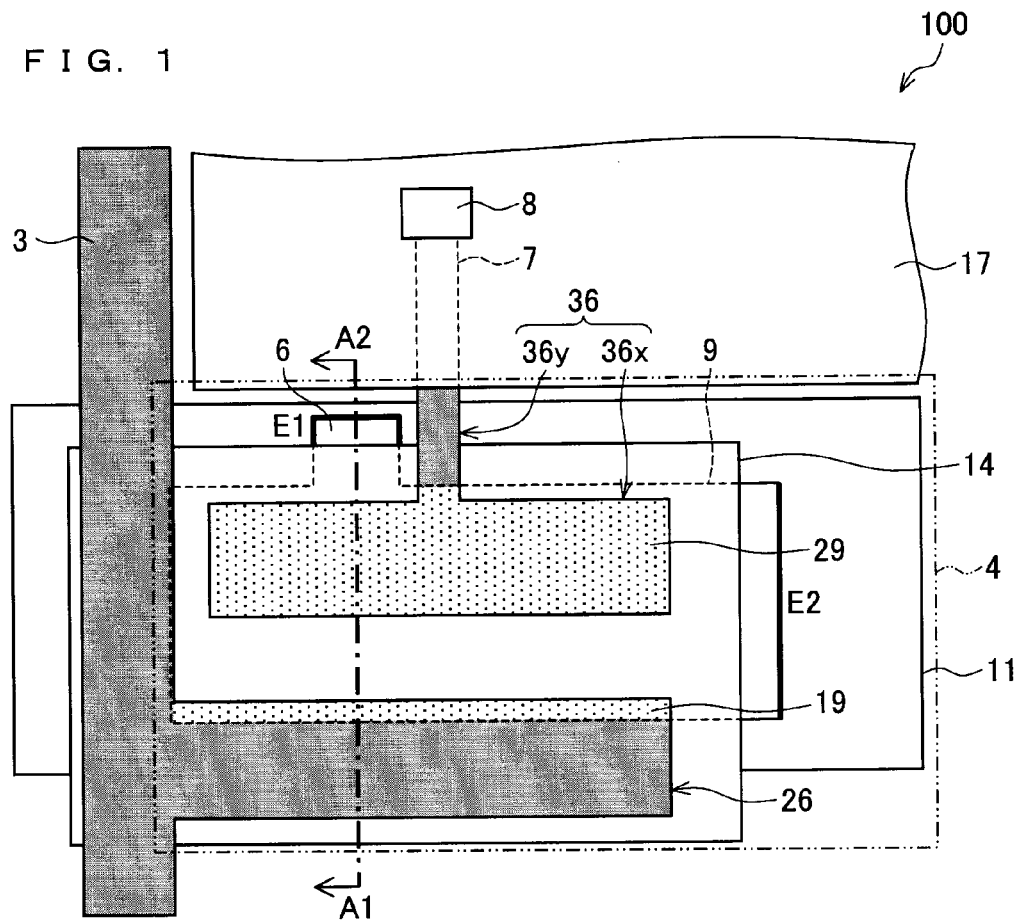
FIG. 1 is a plan view illustrating an arrangement of an active matrix substrate according to a preferred embodiment of the present invention.

FIG. 1 is a plan view illustrating an arrangement of an active matrix substrate according to a preferred embodiment of the present invention. As illustrated in the figure, an active matrix substrate 100 includes a pixel electrode 17 and a TFT (thin film transistor) 4. A scanning signal line (not illustrated) and a data signal line 3 are arranged perpendicularly to each other around the pixel electrode 17, and the TFT 4 is provided in the vicinity of an intersection of the scanning signal line and the data signal line 3.

The TFT 4 includes a gate electrode 11 which is a portion of the scanning signal line, a source electrode 26, and a drain electrode 36. The source electrode 26 is connected to the data signal line 3, and the drain electrode 36 is connected to the pixel electrode 17 via a drain lead wiring 7 and a contact hole 8. With this arrangement, data (signal potential) from the data signal line 3 is input in the pixel electrode 17 via the source electrode 26 and the drain electrode 36 of the TFT 4.

The gate electrode 11 preferably has a rectangular or substantially rectangular shape whose longitudinal direction is in a scanning signal line direction (left-to-right direction in the figure) in its plan view. In the active matrix substrate of the present preferred embodiment, a thin section 9 is provided in a gate insulating film covering the gate electrode 11, which thin section has a film thickness thinner than its periphery. The gate insulating film includes a plurality of gate insulating layers, and at least one of the gate insulating layers is partially removed or thinly deposited so that the thin section 9 (a lower insulating film region) is formed. The thin section 9 is provided on the gate electrode 11 (so as to be overlapped therewith), and preferably has a rectangular or substantially rectangular shape whose longitudinal direction is in the scanning signal line direction, and in which a convex section 6 is provided at a portion of one long side thereof. A preferably high-resistance semiconductor layer 14 is provided on the gate insulating film and preferably has a rectangular or substantially rectangular shape whose longitudinal direction is in the scanning signal line direction. A major portion of the semiconductor layer 14 is overlapped with the gate electrode 11 and the thin section 9 (of the gate insulating film). An edge E2 corresponding to one short side of the thin section 9 (in a data signal line direction) is not overlapped with the semiconductor layer 14, and is located outside an edge of the semiconductor layer 14. An edge E1 which is a portion of an edge of the convex section 6 is not overlapped with the edge of the semiconductor layer 14, either, and is located outside the edge of the semiconductor layer 14.

The source electrode 26 and the drain electrode 36 are provided on the semiconductor layer 14 (in the same layer), and face each other with a given gap therebetween. The source electrode 26 preferably has a rectangular or substantially rectangular shape whose longitudinal direction is in the scanning signal line direction (left-to-right direction in the figure). The source electrode 26 is on the semiconductor layer 14 (overlapped with the semiconductor layer 14), and a major portion thereof is overlapped with the gate electrode 11. The drain electrode 36 includes: an extending section 36x, which preferably has a rectangular or substantially rectangular shape whose longitudinal direction is in the scanning signal line direction (left-to-right direction in the figure); and a connection section 36y for connecting the extending section 36x to the drain lead electrode 7. The connection section 36y extends from the extending section 36x away from the source electrode 26 (for example, perpendicularly), and its width in the scanning signal line direction (that is, in a longitudinal direction of the extending section 36x) is narrower than a width of the extending section 36x in the scanning signal line direction. The drain electrode 36 is on the semiconductor layer 14 (overlapped with the semiconductor layer 14), and a major portion thereof is overlapped with the gate electrode 11.

Here, each of the electrodes (26 and 36) is arranged such that an overlapping area (TS overlapping area 19) of the thin section 9 (in the gate insulating film) with the source electrode 26 is smaller than an overlapping area (TD overlapping area 29) of the thin section 9 with the drain electrode 36. To put it differently, when viewed perspectively, while a major portion of the extending section 36x in the drain electrode 36 (the extending section 36x and a part of the connection section 36y) is located inside an edge of the thin section 9, only a portion of the source electrode 26 is located inside the edge of the thin section 9.

Moreover, the connection section 36y in the drain electrode 36 is arranged so as to cross, in this order, an edge corresponding to one long side of the thin section 9 (the side where the convex section 6 is provided), an edge corresponding to one long side of the semiconductor layer 14, and an edge corresponding to one long side of the gate electrode 11. Furthermore, when viewed in the scanning signal line direction, the edges E1 and E2 of the thin section 9 are respectively provided at each side of the connection section 36y.

Figure 2:
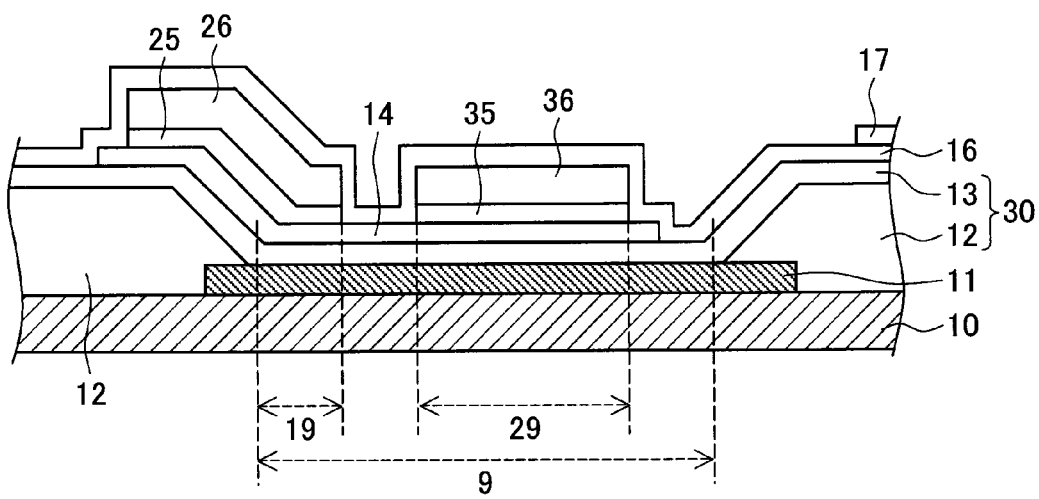
FIG. 2 is a cross sectional view of a TFT region of the active matrix substrate.

FIG. 2 is a cross sectional view taken along arrows A1-A2 of FIG. 1 (a cross sectional view of a TFT region). As illustrated in the figure, in a TFT region, a gate electrode 11 (scanning signal line 2) and a gate insulating film 30 (a first gate insulating layer 12 and a second gate insulating layer 13) are provided on a transparent insulating substrate 10 such as a glass or plastic. The first gate insulating layer 12 and the second gate insulating film 13 are successively provided on the substrate and the gate electrode 11 as the gate insulating film 30. The first gate insulating layer 12 on the gate electrode 11 is fully or partially removed so as to form a thin section 9. As illustrated in FIG. 2, the gate insulating film 30 has such a shape that, a portion thereof adjacent to edges of the thin section 9 has a forward tapered shape. A high-resistance semiconductor layer 14 is patterned on the second gate insulating layer 13. While a source electrode 26 is patterned on the high-resistance semiconductor layer 14 with a low-resistance semiconductor layer 25 provided therebetween, a drain electrode 36 is patterned on the high-resistance semiconductor layer 14 with a low-resistance semiconductor layer 35 provided therebetween. A planar shape of each of the electrodes (26 and 36) is as described above (see FIG. 1), and these electrodes are arranged such that an overlapping area (TS overlapping area 19) of the thin section 9 (in the gate insulating film) with the source electrode 26 is smaller than an overlapping area (TD overlapping area 29) of the thin section 9 with the drain electrode 36.

Then, an interlayer insulating film 16 is provided on each of the electrodes (26 and 36) and a portion of the semiconductor layer 14 and the second gate insulating layer 13 which is not overlapped with each of the electrodes (26 and 36). The interlayer insulating film 16 covers the TFT 4, the scanning signal line 2, the data signal line 3, and the drain lead wiring 7. Furthermore, a pixel electrode 17 is provided on the interlayer insulating film 16.

In the active matrix substrate 100, the thin section (low-layer insulating film region) which is overlapped with the gate electrode 11 is provided in the gate insulating film 30, thereby resulting in that characteristics of the transistor 4 is maintained. Meanwhile, the overlapping area 19 of the thin section 9 with the source electrode 26 is smaller than the overlapping area 29 of the thin section 9 with the drain electrode 36, thereby resulting in that shot-circuits between the gate electrode 11 and the source electrode 26 is prevented. In this way, with the above arrangement, it is possible to prevent generation of short-circuits between signal lines (between the data signal line and the scanning signal line), which are not easily repaired, while the characteristics of the transistor 4 are maintained.

Furthermore, in the active matrix substrate 100, a planarizing film (a first gate insulting layer) 12, which is made of a SOG material, is used as a bottom layer of the gate insulating film 30. This reduces unevenness in the intersection of the scanning signal line and the data signal line, so that a number of steps where the data signal line crosses the scanning signal line is reduced, with the result that breaking of the data signal line at the intersection of both signal lines hardly occurs. In addition, if the gate insulating film 30 has such a shape that, a portion thereof adjacent to edges of the thin section 9 has a forward tapered shape, then breaks in the source electrode 26 and the drain electrode 36, which are provided on the thin section 9, hardly occur.

Generally, the second gate insulating layer 13 (silicon nitride film) at a tapering section of the gate electrode is easily damaged. However, in this preferred embodiment, since the first gate insulating layer is a planarizing film, it is possible to maintain the thickness of the second insulating layer 13 at the tapering section, thereby damages in the second gate insulating layer 13 can be prevented.

When such a planarizing film (SOG film) which is made of a spin-on-glass (SOG) material is used as the first gate insulating layer 12 which is the bottom layer, it is possible to successively provide the second insulating layer (silicon nitride film) 13, the high-resistance semiconductor layer 14, and the low-resistance semiconductor layers (25 and 35) on the first gate insulating layer 12 by a CVD method or the like method. This makes it possible to shorten its production processes.

In the active matrix substrate, a width of the connection section 36y (in an edge direction corresponding to a long side of the thin section 9) is narrower than that of the extending section 36x (in the edge direction corresponding to the long side of the thin section 9). This can prevent changes in the overlapping area 29 of the drain electrode 36 with the thin section 9 even when the drain electrode 36 is not provided at an appropriate position, and changes in Cgd (parasitic capacitance between the gate electrode and the drain electrode). This allows for reduction in unevenness of drain lead voltage while the transistor is off, and improvement in display quality of a liquid crystal display device in which the active matrix substrate is used.

Figure 8:
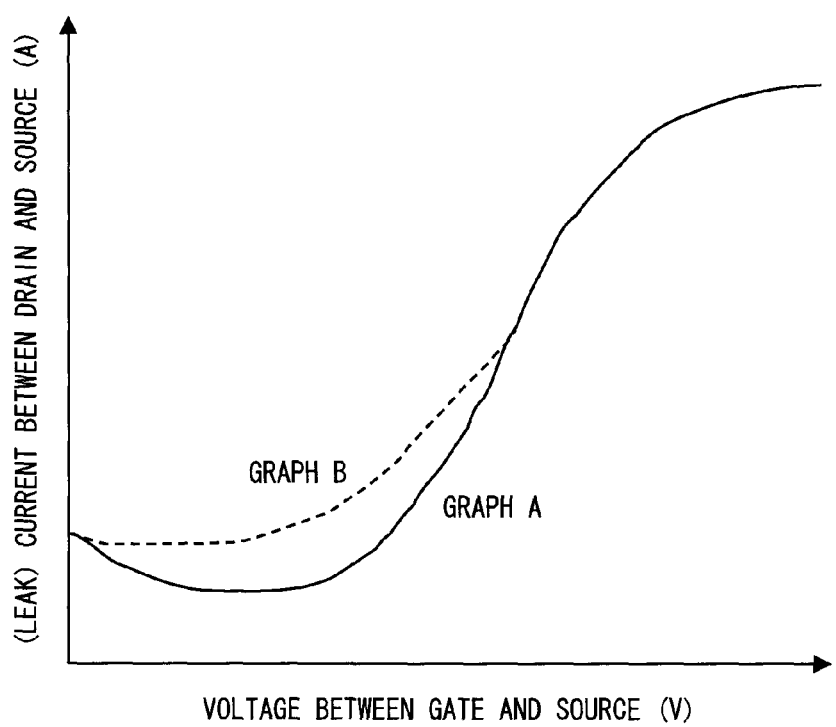
FIG. 8 is a graph illustrating an effect for preventing a leak current in the active matrix substrate.

In the active matrix substrate 100, a portion of an edge of the thin section 9 sticks out of an outer circumference of the semiconductor layer 14. In a case where the thin section is fully inside an edge of the semiconductor layer when viewed perspectively, when the transistor is off, leak current between the source and the drain (off-leak current between the source and the drain which flows in an area other than a channel region) easily flows via the edge section of the semiconductor layer. This is because off voltage is not sufficiently applied to the semiconductor region in a thick portion of the gate insulating film. For this reason, in this preferred embodiment, a portion of the edge (E1 and E2) of the thin section 9 is arranged so as to stick out of the outer circumference of the semiconductor layer 14. This can prevent leak current through the edge of the semiconductor layer 14. This makes it possible to improve an OFF-characteristic of the transistor 4. This effect is illustrated in FIG. 8. If E1 and E2 are provided in FIG. 1, then the OFF-characteristic of the TFT (GS voltage—DS leak voltage characteristic) can be improved from a graph B to a graph A, as illustrated in FIG. 8.

Figure 10:
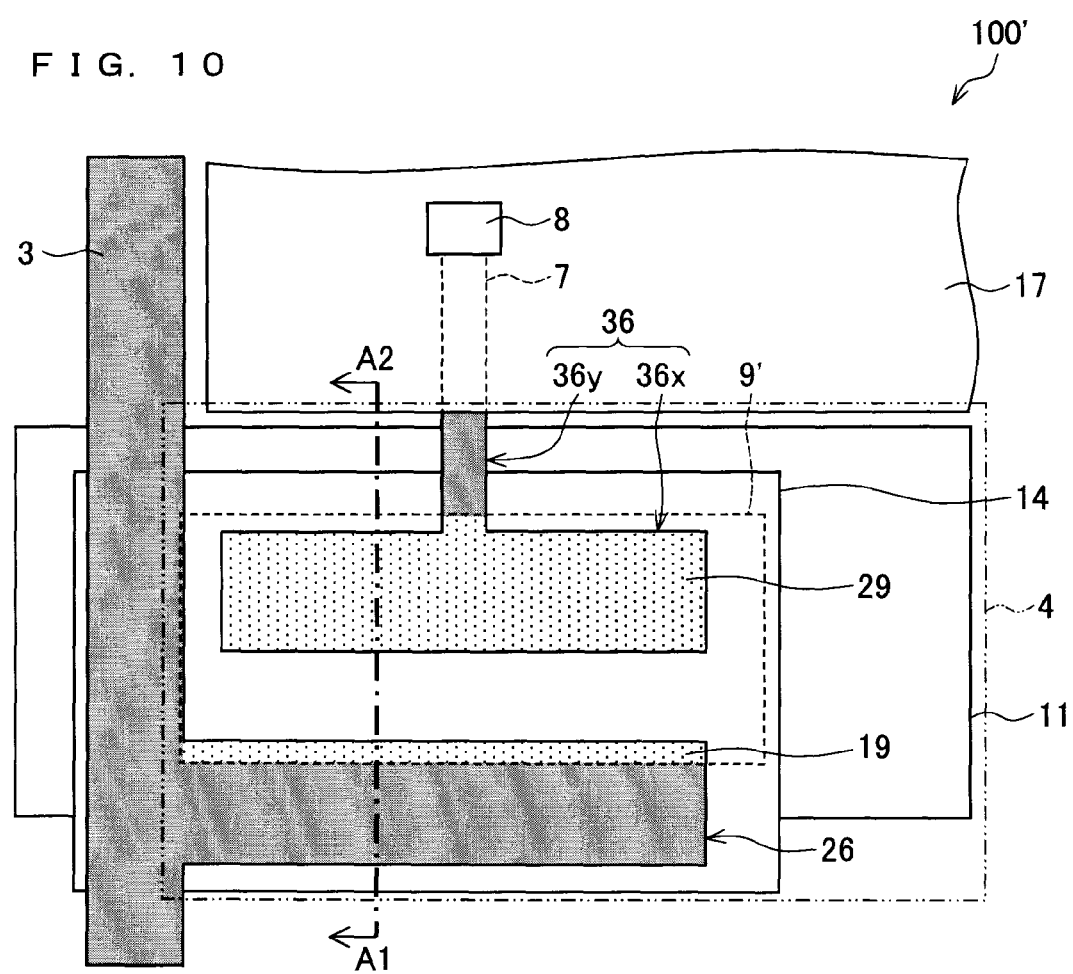
FIG. 10 is a plan view illustrating an exemplary arrangement of the active matrix substrate.

The active matrix substrate illustrated in FIG. 1 can be modified to an active matrix substrate illustrated in FIG. 10. In an active matrix substrate 100', a thin section 9' preferably has a rectangular or substantially rectangular shape (a convex section is not provided), and the thin section 9' is arranged so as to be fully placed inside an edge of a semiconductor layer 14 when viewed perspectively. Other arrangements are the same as FIG. 1.

The following describes an example of a method for producing the active matrix substrate (a basic portion) with reference to FIGS. 1 and 2.

In this preferred embodiment, a scanning signal line which also works as a gate electrode 11 of a TFT 4 is provided on a transparent insulating substrate 10 such as a glass or a plastic. The scanning signal line (the gate electrode 11) is provided such that a metal film of titanium, chromium, aluminum, molybdenum, tantalum, tungsten, copper, or the like, its alloy film, or its laminated film is deposited with about 1000 Å to about 3000 Å in film thickness by a sputtering method or the like, and then patterned into a desired shape by a photo-etching method or the like, for example.

In this preferred embodiment, a first gate insulating layer 12 is provided such that a planarizing film made of a spin-on-glass (SOG) material or the like is applied by a spin coat method so as to cover the scanning signal line and the gate electrode 11. Although an insulating material (for example, a material including an organic material) can be used for the gate insulating layer 12, in this preferred embodiment, the SOG material is used. The SOG material indicates a material which can form a glass film (silica based coating) by an applying method such as a spin coat method. Examples of the material including an organic material other than the SOG material encompass an acrylic resin material, an epoxy resin, a polyimide resin, a polyurethane resin, a polysiloxane resin, a novolac resin.

Among such a SOG material, a spin-on-glass material including an organic ingredient (so-called an organic SOG material) is preferable as the first gate insulating layer 12. Especially, a SOG material whose skeleton is a Si—O—C bond and a SOG material whose skeleton is a Si—C bond can be preferably used as such an organic SOG material. The organic SOG material has a low relative permittivity, and can be made into a thick film easily. Accordingly, if the organic SOG material is used, then it is possible to easily form a thick first gate insulating layer 12 with the low relative permittivity, and in addition, it is possible to planarize the first gate insulating layer 12 (if the organic SOG material is used, then it is possible to form the first gate insulating layer 12 to be thick while suppressing the relative permittivity thereof to be low, thereby resulting in that a planarizing effect can be obtained easily). As such a SOG material having Si—O—C bond, materials disclosed in Japanese Unexamined Patent Publication, Tokukai, No. 2001-98224 and Japanese Unexamined Patent Publication, Tokukaihei, No. 6-240455 and DD1100 made by Dow Corning Toray Silicone Co., Ltd., which is disclosed in page 617 of Proceedings of IDW (Information Display Workshops) '03 can be used for example. As the SOG material having a Si—C bond as its skeleton, for example, a material disclosed in Japanese Unexamined Patent Publication, Tokukaihei, No. 10-102003 can be used.

Moreover, an organic SOG material including a silica filler can be used for the first gate insulating layer 12. In such a case, it is preferable that the silica filler be dispersed in a base material made from an organic SOG material. With such an arrangement, even in a large substrate 20, the first gate insulating layer 12 can be formed without any cracks. A grain size of the silica filler is, for example, in a rage of about 10 nm to about 30 nm, and its content ratio is in a range of about 20 volume % to about 80 volume %, for example. LNT-025 made by Catalysts and Chemicals Industries Co., Ltd. can be used as the organic SOG material including a silica filler.

In this preferred embodiment, the organic SOG material is applied to the substrate by about 1.5 μm to about 2.0 μm in thickness, for example. Then, a pattern illustrated in FIG. 1 is formed by a photo-etching method. In the etching process, dry etching is performed by using a mixed gas of carbon tetrafluoride ($CF_4$) and oxide ($O_2$) so that the organic SOG (the first gate insulating layer 12) in the TFT 4 region is removed. At the same time, a vicinity of edges in a section where the first gate insulating layer is removed can be formed in a forward tapered shape by adjusting content ratio of the carbon tetrafluoride ($CF_4$) and the oxide ($O_2$).

Sequentially, a silicon nitride film which is to be a second gate insulating layer 13, a high-resistance semiconductor layer 14 which is made of amorphous silicon, polysilicon or the like, and low-resistance semiconductor layers (25 and 35) which are made of $n^+$-amorphous silicon or the like are deposited consecutively by a plasma CVD (Chemical Vapor Deposition) method or the like, and are then patterned by a photo-etching method or the like. Each film thickness is, for example, arranged such that the silicon nitride film as the second gate insulating layer 13 is about 3000 Å to about 5000 Å in thickness, an amorphous silicon film as the high-resistance semiconductor layer 14 is about 1000 Å to about 3000 Å in thickness, and a $n^+$-amorphous silicon film as the low-resistance semiconductor layers (25 and 35) is about 400 Å to about 700 Å in thickness, for example.

Then, a data signal line 3 (see FIG. 1), a drain lead wiring 7, a drain electrode 36, and a source electrode 26 are formed in the same process. The data signal line 3 and the drain lead wiring 7 are formed such that a metal film of titanium, chromium, aluminum, molybdenum, tantalum, tungsten, copper, or the like, its alloy film, or its laminated film is deposited with about 1000 Å to about 3000 Å in thickness by a sputtering method or the like, and then patterned in a necessary shape by a photo-etching method or the like.

A TFT 4 (see FIG. 1) is formed such that the data signal line 3, the drain electrode 36, and the drain lead wiring 7 are patterned on a mask, and according to the mask, a channel etching is performed by dry-etching for the high-resistance semiconductor layer 14 which is an amorphous silicon film or the like, and the low-resistance semiconductor layers (25 and 35) which are n$^+$-amorphous silicon films or the like. Moreover, a resin film such as a photosensitive acrylic resin, an inorganic insulating film such as silicon nitride and silicon oxide, a laminated film thereof, or the like is provided as an interlayer insulating film 16. As such a laminated film, for example, a laminated film of (i) a silicon nitride film with about 2000 Å to about 5000 Å in thickness which is deposited by a plasma CVD method or the like, and (ii) a photosensitive acrylic resin film with about 20000 Å to about 40000 Å in thickness which is deposited on that silicon nitride film by a spin coat method can be used, for example. In this preferred embodiment (see FIG. 2), only an interlayer insulating film 16 made of nitride silicon is provided. A contact hole 8 (see FIG. 1) is formed so as to pass through the interlayer insulating film 16 which covers the TFT 4, the scanning signal line (gate electrode 11), the data signal line 3, the drain electrode 36, and the drain lead wiring 7. The contact hole is patterned by a photo-etching method.

Then, a pixel electrode 17 is formed on the interlayer insulating film, for example, such that a conductive film having a transparency such as ITO, IZO, zinc oxide, or tin oxide is formed by a sputtering method or the like with about 1000 Å to about 2000 Å in thickness, for example, and then patterned in a necessary shape by a photo-etching method.

Figure 3:
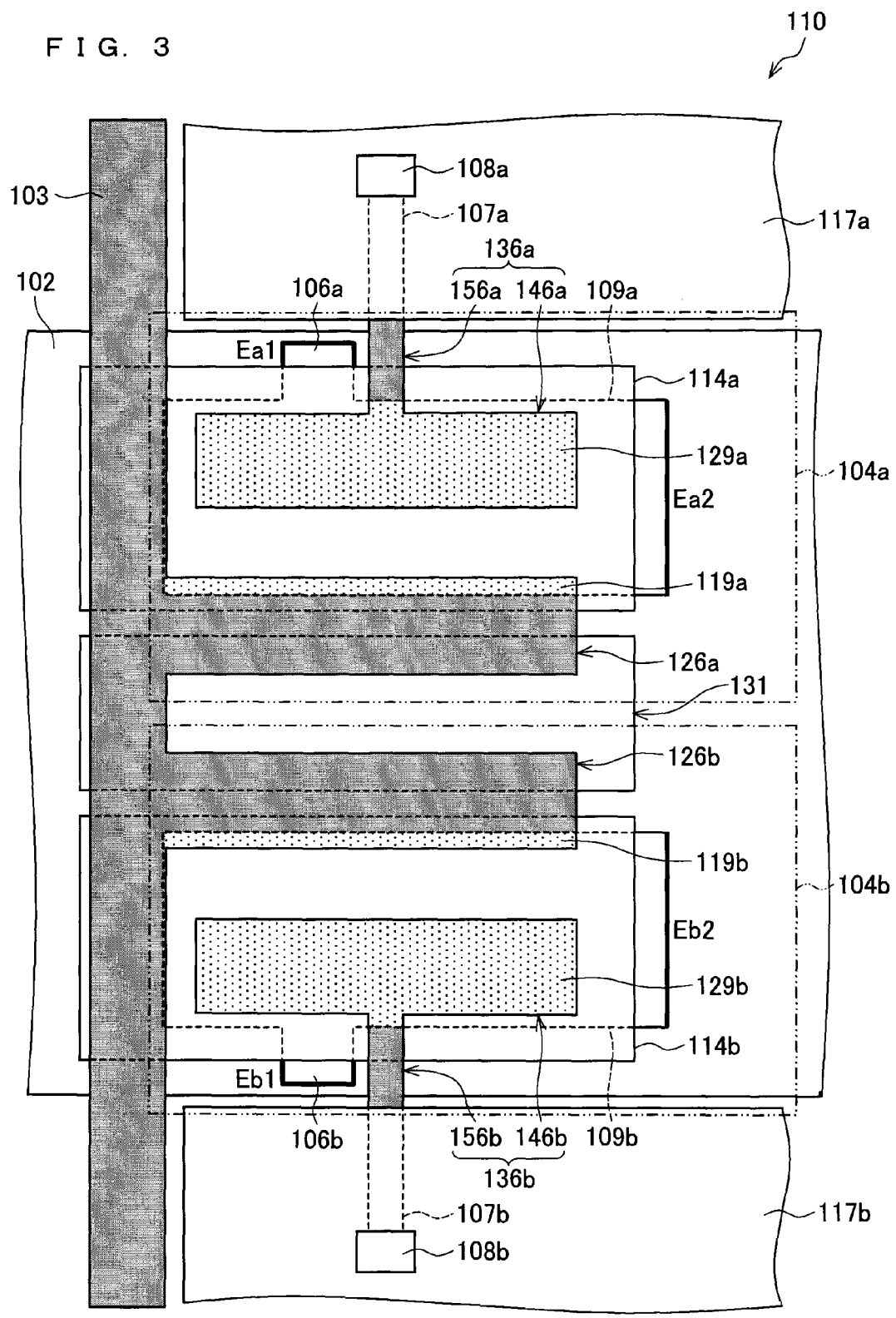
FIG. 3 is a cross sectional view of an arrangement of the active matrix substrate.

As illustrated in FIG. 3, the active matrix substrate can be a multi-pixel structure in which a plurality of regions having different brightness are provided within one pixel region. As illustrated in the figure, an active matrix substrate 110 includes first and second TFTs 104a and 104b, and first and second pixel electrodes 117a and 117b within one pixel region. A scanning signal line 102 and a data signal line 103, which are perpendicular to each other, are provided around the first and the second pixel electrodes 117a and 117b. The first and second TFTs 104a and 104b are provided in the vicinity of an intersection of the scanning signal line 102 and the data signal line 103.

The first TFT 104a includes a source electrode 126a and a drain electrode 136a, and a portion of the scanning signal line 102 works as a gate electrode of the first TFT 104a. The source electrode 126a is connected to the data signal line 103, and the drain electrode 136a is connected to the first pixel electrode 117a via a drain lead wiring 107a and a contact hole 108a. The second TFT 104b includes a source electrode 126b and a drain electrode 136b, and a portion of the scanning signal line 102 works as a gate electrode of the second TFT 104b. The source electrode 126b is connected to the data signal line 103, and the drain electrode 136b is connected to the second pixel electrode 117b via a drain lead wiring 107b and a contact hole 108b.

In the active matrix substrate 110, data from the data signal line 103 is supplied to each of the first and second pixel electrodes 117a and 117b via each of the source electrodes 126a and 126b, and each of the drain electrodes 136a and 136b in the TFTs 104a and 104b. However, the first and the second pixel electrodes 117a and 117b are controlled to be different potentials, for example, by retention capacitance wirings (two retention capacitance wirings which are applied by signal voltages having inverse phases with each other). In a liquid crystal panel including the active matrix substrate having such a multi-pixel structure (illustrated in FIG. 3), both of a white subpixel and a black subpixel can be provided within one pixel, thereby resulting in that a halftone can be expressed by an area coverage modulation, and excess brightness when viewed from a linear angle can be improved.

In the active matrix substrate 110, a thin section (low-layer insulating film region) 109a whose film thickness is thinner than that of its periphery is provided in a gate insulating film covering the scanning signal line 102 (the gate electrode). The gate insulating film includes a plurality of gate insulating layers, and at least one of the layers is partially removed or deposited to be thin so as to form the thin section 109a. The thin section 109a is provided on the scanning signal line 102 (overlapped therewith), and preferably has a rectangular or substantially rectangular shape whose longitudinal direction is in a scanning signal line direction, and in which a convex section 106a is provided in a portion of one long side thereof. A (high-resistance) semiconductor layer 114a is provided on the gate insulating film preferably having a rectangular or substantially rectangular shape whose longitudinal direction is in a scanning signal line direction. A major portion of the semiconductor layer 114a is overlapped with the scanning signal line 102 and the thin section 109a.

An edge Ea2 corresponding to one short side (in a data signal line direction) of the thin section 9a is not overlapped with the semiconductor layer 114, and is located outside an edge of the semiconductor layer 114a. An edge Ea1 corresponding to a portion of the convex section 106a of the thin section 109a is not overlapped with the semiconductor layer 114a, either, and is placed outside the edge of the semiconductor layer 114a.

The source electrode 126a and the drain electrode 136a are provided on the semiconductor layer 114a (in the same layer), and face each other with a given gap therebetween. The source electrode 126a is extended from the data signal line 103 and preferably has a rectangular or substantially rectangular shape whose longitudinal direction is in the scanning signal line direction (left-to-right direction in the figure). The source electrode 126a is on the semiconductor layer 114a (overlapped with the semiconductor layer 114a), and its major portion is overlapped with the scanning signal line 102. The drain electrode 136a includes: an extending section 146a, which preferably has a rectangular or substantially rectangular shape whose longitudinal direction is in the scanning signal line direction (left-to-right direction in the figure); and a connection section 156a for connecting the extending section 146a to the drain lead electrode 107a. The connection section 156a extends from the extending section 146a away from the source electrode 126a (for example, perpendicularly), and its width in the scanning signal line direction (that is, in the longitudinal direction of the extending section 146a) is narrower than a width of the extending section 146a in the scanning signal line direction. The drain electrode 136a is on the semiconductor layer 114a (overlapped with the semiconductor layer 114a), and its major portion is overlapped with the scanning signal line 102.

Each of the electrodes (126a and 136a) is arranged such that an overlapping area (TS overlapping area 119a) of the thin section 109a with the source electrode 126a is smaller than an overlapping area (TD overlapping area 129a) of the thin section 109a with the drain electrode 136a. That is, when viewed perspectively, while a major portion of the extending section 146a in the drain electrode 136a (the extending section 146a and a portion of the connection section 156a) is located inside an edge of the thin section 109a, only a portion of the source electrode 126a is located inside the edge of the thin section 109a.

Moreover, the connection section 156a in the drain electrode 136a is arranged so as to cross, in this order, an edge corresponding to one long side of the thin section 109a (a side where the convex section 106a is provided), an edge corresponding to one long side of the semiconductor layer 114a, and an edge corresponding to one long side of the scanning signal line 102. The edges Ea1 and Ea2 of the thin section 109a are respectively disposed at each side of the connection section 156a when viewed in the scanning signal line direction.

Furthermore, in the active matrix substrate 110, a thin section (low-layer insulating film region) 109b whose film thickness is thinner than that of its periphery is provided in the gate insulating film covering the scanning signal line 102 (the gate electrode). The gate insulating film includes a plurality of gate insulating layers, and at least one of the gate insulating layers is partially removed or deposited to be thin so as to form the thin section 109b. The thin section 109b is provided on the scanning signal line 102 (overlapped therewith), and preferably has a rectangular or substantially rectangular shape whose longitudinal direction is in the scanning signal line direction. A flare section 106b is provided in a portion of one long side of the rectangular or substantially rectangular shape. A (high-resistance) semiconductor layer 114b is provided on the gate insulating film preferably having a rectangular or substantially rectangular shape whose longitudinal direction is in the scanning signal line. A major portion of the semiconductor layer 114b is overlapped with the scanning signal line 102 and the thin section 109b.

An edge Eb2 corresponding to one short side (in the data signal line direction) of the thin section 109b is not overlapped with the semiconductor layer 114b, and is located outside an edge of the semiconductor layer 114b. Moreover, an edge Eb1 corresponding to a portion of the convex section 106b of the thin section 109b is not overlapped with the semiconductor layer 114b, either, and is located outside the edge of the semiconductor layer 114b.

The source electrode 126b and the drain electrode 136b are provided on the semiconductor layer 114b (in the same layer), and face each other with a given gap therebetween. The source electrode 126b is extended from the data signal line 103, and preferably has a rectangular or substantially rectangular shape whose longitudinal direction is in the scanning signal line direction (left-to-right direction in the figure). The source electrode 126a and the source electrode 126b are arranged so as to face each other at some intervals. The source electrode 126b is on the semiconductor layer 114b (overlapped with the semiconductor layer 114b), and its major portion is overlapped with the scanning signal line 102. The drain electrode 136b includes: an extending section 146b, which is preferably rectangular or substantially rectangular having a longitudinal direction in the scanning signal line direction (left-to-right direction in the figure); and a connection section 156b for connecting the extending section 146b to the drain lead electrode 107b. The connection section 156b extends from the extending section 146b away from the source electrode 126b (for example, perpendicularly), and its width in the scanning signal line direction (that is, in the longitudinal direction of the extending section 146b) is narrower than a width of the extending section 146b in the scanning signal line direction. The drain electrode 136b is on the semiconductor layer 114b (overlapped with the semiconductor layer 114b), and its major portion is overlapped with the scanning signal line 102.

Here, each of the electrodes (126b and 136b) is arranged such that an overlapping area (TS overlapping area 119b) of the thin section 109b with the source electrode 126b is smaller than an overlapping area (TD overlapping area 129b) of the thin section 109b with the drain electrode 136b. To put it differently, when viewed perspectively, while a major portion of the extending section 146b in the drain electrode 136b (the extending section 146b and a part of the connection section 156b) is located inside an edge of the thin section 109b, only a portion of the source electrode 126b is located inside the edge of the thin section 109b.

Moreover, the connection section 156b in the drain electrode 136b is arranged so as to cross, in this order, an edge corresponding to one long side of the thin section 109b (a side where the convex section 106b is provided), an edge corresponding to one long side of the semiconductor layer 114b, and an edge corresponding to the other long of the scanning signal line 102. The edges Eb1 and Eb2 of the thin section 109b are respectively located at each side of the connection section 156b when viewed in the scanning signal line direction.

Furthermore, a hollow section 131 (a section where a portion of the gate electrode is hollowed out) is provided in the scanning signal line 102 including its intersection with the data signal line 103. The hollow section 131 extends from the intersection to a region overlapped with a space between the semiconductor layers 114a and 114b.

Figure 11:
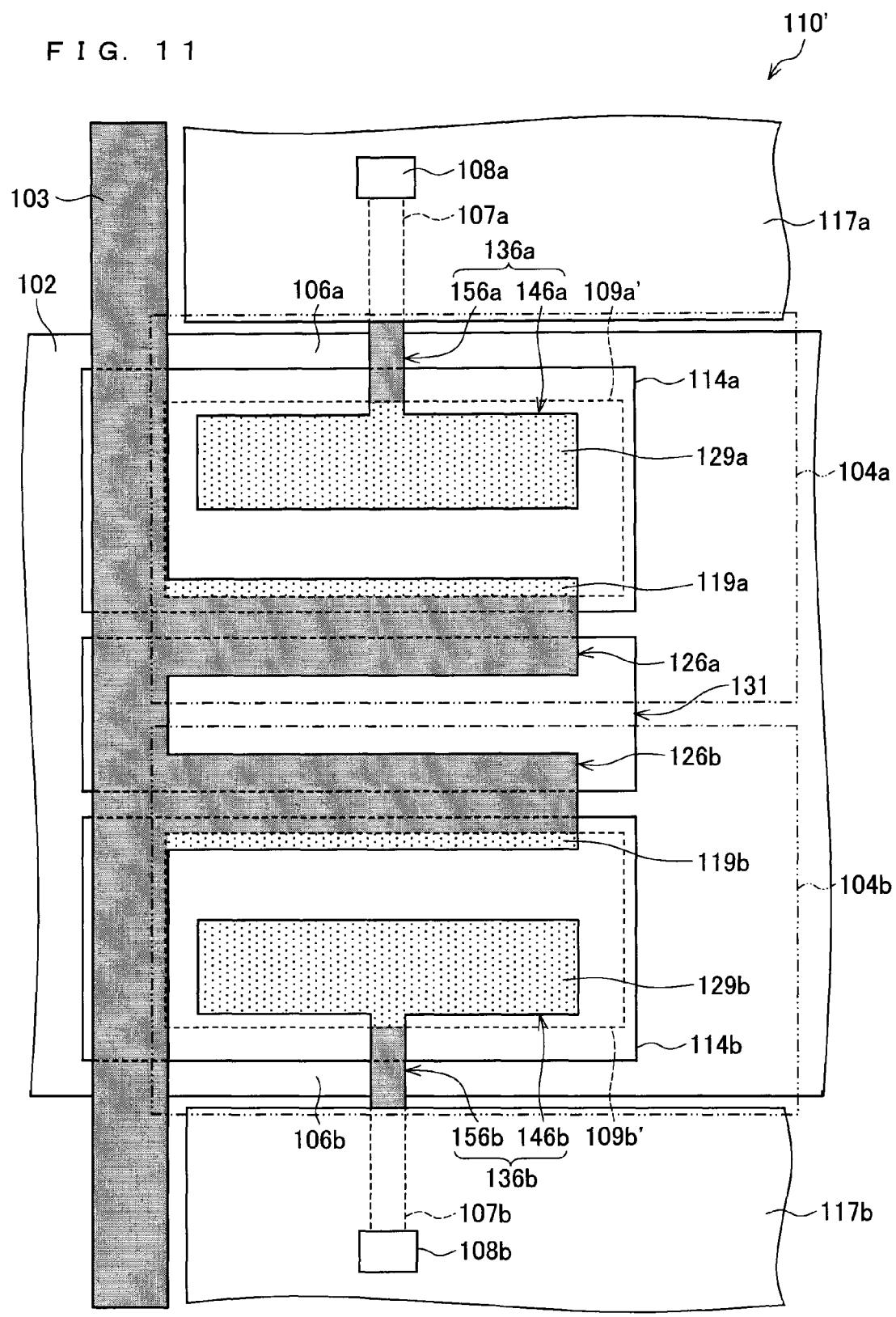
FIG. 11 is a plan view illustrating an exemplary arrangement of the active matrix substrate.

The active matrix substrate illustrated in FIG. 3 can be also modified to an active matrix substrate illustrated in FIG. 11. In an active matrix substrate 110' in FIG. 11, a thin section 109a' preferably has a rectangular or substantially rectangular shape (no convex section is provided), and is arranged such that the thin section 109a' is disposed fully inside an edge of a semiconductor layer 114a when viewed perspectively. In addition, a thin section 109b' preferably having a rectangular or substantially rectangular shape (no convex section is provided), and is arranged such that the thin section 109b' is located fully inside an edge of the semiconductor layer 114b. Moreover, no hollow section is provided in a scanning signal line 102' (differently from FIG. 3). Other arrangements are the same as FIG. 3.

The following describes one example of a method for repair of short-circuits between the data signal line and the scanning signal line in the active matrix substrate 110 (a leak between the source and the gate, a SG leak).

Figure 6:
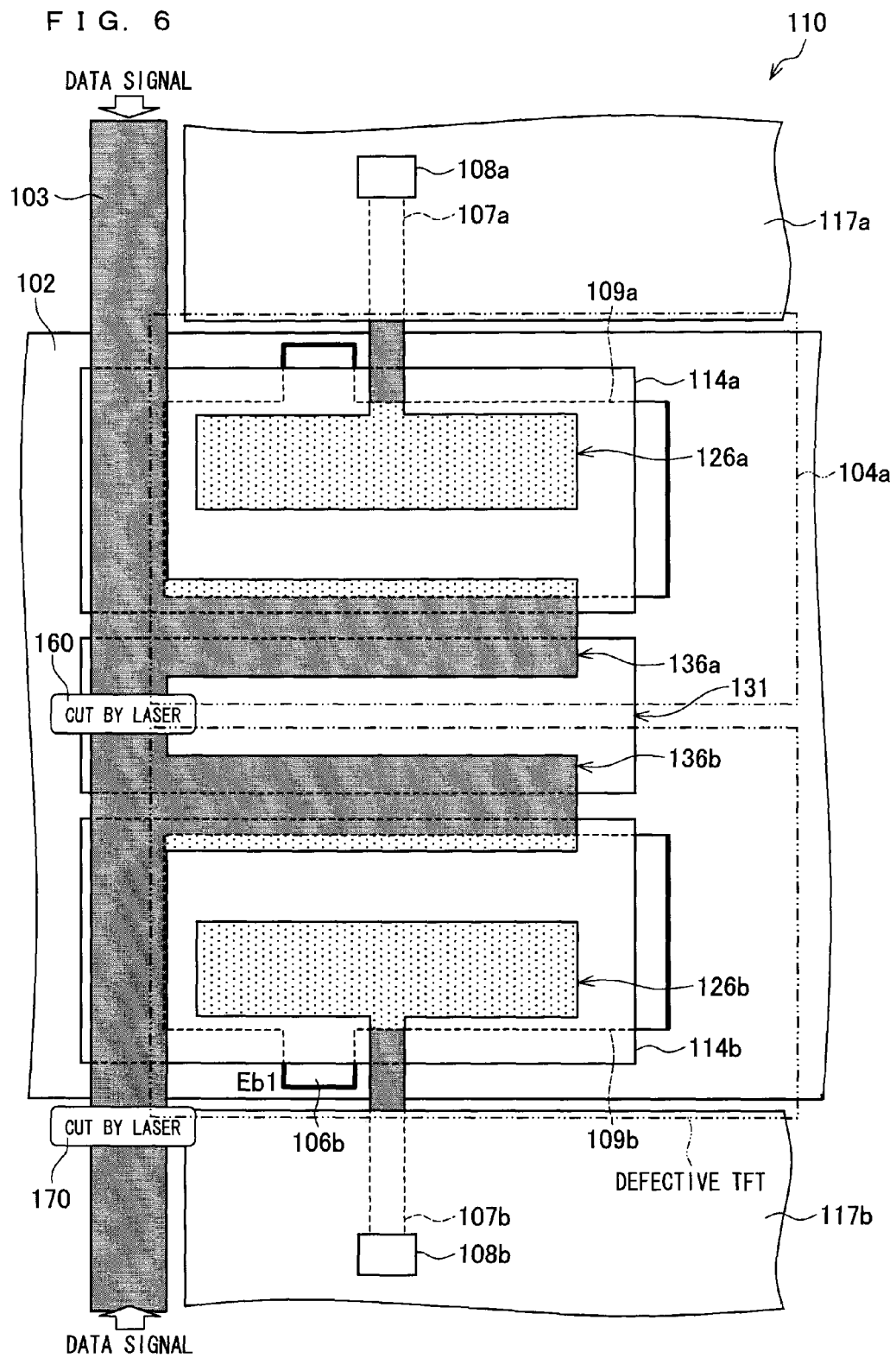
FIG. 6 is a plan view illustrating a method for repair of a defect in the active matrix substrate.

As illustrated in FIG. 6, when a SG leak occurs in a defective TFT, laser is irradiated to disconnection sections 160 and 170 from a surface or a backside of a substrate so as to fracture and split a data signal line 103. Thereby, the defective TFT is electrically isolated. A wavelength of laser to be used may be, for example, fourth higher harmonics (wavelength of about 266 nm, for example) of YAG laser. Then, repair by an auxiliary wiring (a redundant wiring, not illustrated) is carried out, and a data signal is input to a TFT 104a via the auxiliary wiring from a data signal non-input side of the data signal line 103. This makes it possible to activate a pixel electrode (sub-pixel electrode) 117a, which is one of pixel electrodes within one pixel.

Accordingly, in a case of a liquid crystal display device in which the active matrix substrate 110 is used is in a normally black mode, this allows dots only within a half-pixel to be black, not all dots within one pixel to be fully black. In a case where the display is in a normally white mode, this allows dots within a half-pixel to be bright. Therefore, if any modification or the like process is further performed for the bright dots to be black, it is possible to make the dots black only in a half-pixel. In either way, a defective size is more reduced compared with a conventional method, and is hardly visible (its display quality becomes a normal level), with the result that a quality level of a liquid crystal display device is improved.

A repair by using an auxiliary (redundant) wiring can be performed by a well-known method (for example, methods disclosed in Japanese Unexamined Patent Publication, Tokukaihei, No. 5-203986 and in Japanese Unexamined Patent publication, Tokukaihei, No. 9-146121). More specifically, for example, an auxiliary wiring (not illustrated) is placed so as to be around or half around a peripheral part of a display region on the active matrix substrate 110 so that an input end and an open end of the data signal line 103 are shorted by the auxiliary wiring.

In the method for repair of a SG leak in this preferred embodiment, a repair is carried out at least after a pixel electrode is provided. However, for example, in a case where the method is applied to a liquid crystal display device, it is more preferable that a repair be carried out after a liquid crystal layer is provided because panel lightning check can be performed. Thereby, a SG leak section is surely electrically separated and repaired by using an auxiliary wiring. The expression "after a liquid crystal layer is provided" means "after an active matrix substrate and a color filter substrate are bonded and a liquid crystal is injected and sealed therein, so as to form a panel". However, this is not only a way, and a repair may be performed after a drain lead wiring is provided, or after a channel etching is carried out.

An inspection method of an active matrix substrate is explained below.

One example of electrical testing is a method using testing equipment to which an electro-optical effect (occurrence that when a liquid crystal is placed in an electrical field, an optical transmittance of the liquid crystal varies according to the strength of the electrical field) is applied. In the testing equipment, a transparent electrode is provided on one side of a modulator in which transmittance linearly varies according to strength of an electrical field in a specified voltage range, and a reflective surface is provided on its opposite side so as to reflect light. The modulator is provided such that the reflective surface faces the active matrix substrate. Light irradiated from the electrode side of the modulator passes through the modulator and is reflected on the reflective surface. The reflected light is received by a CCD (Charge Coupled Devices) camera. A defective pixel and short-circuits (SG leak) between each wiring in which a defective pixel is shown in a wiring form are specified based on strength of the reflective light.

In addition, one example of a visual inspection is a method in which patterns of adjacent picture elements are compared with each other according to pattern recognition, and if there is a difference, it is determined that there is a defect.

Figure 4:
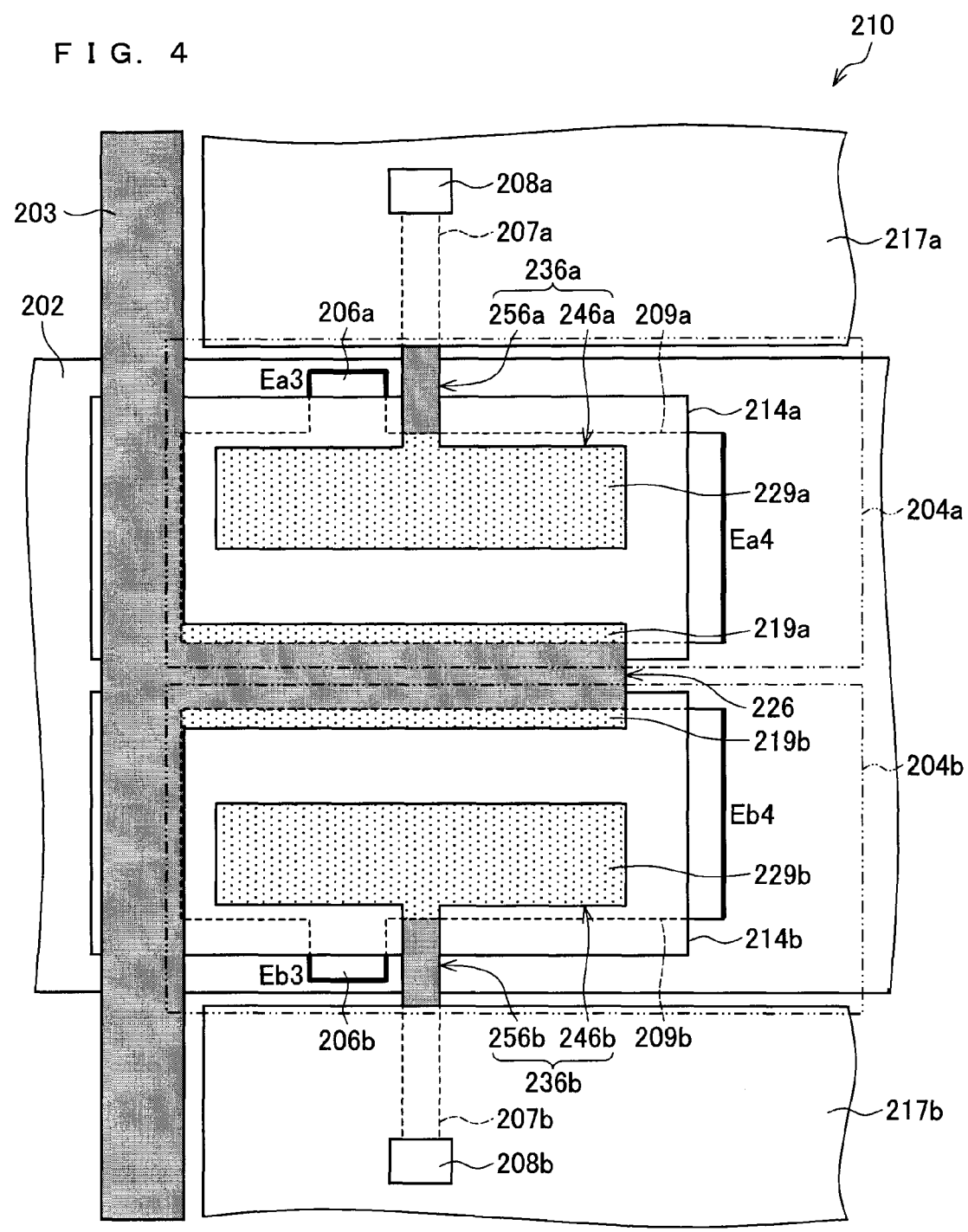
FIG. 4 is a cross sectional view of an arrangement of the active matrix substrate.

The active matrix substrate can be also modified to one illustrated in FIG. 4. This one is also a multi-pixel structure. As illustrated in the figure, an active matrix substrate 210 includes, within one pixel region: first and second TFTs 204*a* and 204*b*; and first and second pixel electrodes 217*a* and 217*b*. A scanning signal line 202 and a data signal line 203, which are perpendicular to each other, are provided around the first and second pixel electrode 217*a* and 217*b*. The first and second TFTs 204*a* and 204*b* are provided in the vicinity of an intersection of the scanning signal line 202 and the data signal line 203.

The first TFT 204*a* includes a source electrode 226 and a drain electrode 236*a*, and a portion of the scanning signal line 202 works as a gate electrode of the first TFT 204*a*. The source electrode 226 is connected to the data signal line 203, and the drain electrode 236*a* is connected to the first pixel electrode 217*a* via a drain lead wiring 207*a* and a contact hole 208*a*. In addition, the second TFT 204*b* includes the source electrode 226 and a drain electrode 236*b*, and a portion of the scanning signal line 202 works as a gate electrode of the second TFT 204*b*. The source electrode 226 is connected to the data signal line 203, and the drain electrode 236*b* is connected to the second pixel electrode 217*b* via a drain lead wiring 207*b* and a contact hole 208*b*.

Thus, in the arrangement of FIG. 4, the first and second TFTs (204*a* and 204*b*) have a source electrode in common.

In the active matrix substrate 210, a thin section (low-layer insulating film region) 209*a* whose film thickness is thinner than that of its periphery is provided in a gate insulating film covering the scanning signal line 202 (gate electrode). The gate insulating film includes a plurality of gate insulating layers, and at least one of the layers is partially removed or deposited to be thin so as to form the thin section 209*a*. The thin section 209*a* is provided on the scanning signal line 202 (overlapped therewith), and preferably has a rectangular or substantially rectangular shape whose longitudinal direction is in a scanning signal line direction, and in which a convex section 206*a* is provided in a portion of one long side thereof. A (high-resistance) semiconductor layer 214*a* is provided on the gate insulating film preferably having a rectangular or substantially rectangular shape whose longitudinal direction is in the scanning signal line direction. A major portion of the semiconductor layer 214*a* is overlapped with the scanning signal line 202 and the thin section 209*a*.

An edge Ea4 corresponding to one short side (in a data signal line direction) of the thin section 209*a* is not overlapped with the semiconductor layer 214*a*, and is placed outside an edge of the semiconductor layer 214*a*. An edge Ea3 corresponding to a portion of the convex section 206*a* of the thin section 209*a* is not overlapped with the semiconductor layer 214*a*, either, and is placed outside the edge of the semiconductor layer 214*a*.

The source electrode 226 and the drain electrode 236*a* are provided on the semiconductor layer 214*a* (in the same layer), and face each other with a given gap therebetween. The source electrode 226 is extended from the data signal line 203, and preferably has a rectangular or substantially rectnagular shape whose longitudinal direction is in a scanning signal line direction (left-to-right direction). The source electrode 226 is on the semiconductor layer 214*a* (overlapped with the semiconductor layer 214*a*), and its major portion is overlapped with the scanning signal line 202. The drain electrode 236*a* includes: an extending section 246*a*, which preferably has a rectangular or substantially rectangular shape whose longitudinal direction is in the scanning signal line direction (left-to-right direction in the figure); and a connection section 256*a* for connecting the extending section 246*a* to a drain lead electrode 207*a*. The connection section 256*a* extends from the extending section 246*a* to a direction opposite to the source electrode 226 (for example, perpendicular), and its width in the scanning signal line direction (that is, in the longitudinal direction of the extending section 246*a*) is narrower than a width of the extending section 246*a* in the scanning signal line direction. The drain electrode 236*a* is on the semiconductor layer 214*a* (overlapped with the semiconductor layer 214*a*), and its major portion is overlapped with the scanning signal line 202.

Each of the electrodes (226 and 236a) is arranged such that an overlapping area (TS overlapping area 219a) of the thin section 209a with the source electrode 226 is smaller than an overlapping area (TD overlapping area 229a) of the thin section 209a with the drain electrode 236a. That is, when viewed perspectively, while a major portion of the extending section 246a in the drain electrode 236a (the extending section 246a and a portion of the connection section 256a) is located inside an edge of the thin section 209a, only a portion of the source electrode 226 is located inside the edge of the thin section 209a.

Moreover, the connection section 256a in the drain electrode 236a is arranged so as to cross, in this order, an edge corresponding to one long side of the thin section 209a (a side where the convex section 206a is provided), an edge corresponding to one long side of the semiconductor layer 214, and an edge corresponding to one long side of the scanning signal line 202. The edges Ea3 and Ea4 are respectively disposed at each side of the connection section 256a when viewed in the scanning signal line direction.

Furthermore, in the active matrix substrate 210, a thin section (low-layer insulating film region) 209b whose film thickness is thinner than that of its outer circumference is provided in a gate insulating film covering the scanning signal line 202 (gate electrode). The gate insulating film includes a plurality of gate insulating layers, and at least one of the gate insulating layer is partially removed or deposited to be thin so as to form the thin section 209b. The thin section 209b is provided on the scanning signal line 202 (overlapped therewith), and preferably has a rectangular or substantially rectangular shape whose longitudinal direction is in the scanning signal line, and in which a convex section 206b is provided in a portion of one long side thereof. A preferably high-resistance semiconductor layer 214b is provided on the gate insulating film preferably having a rectangular or substantially rectangular shape whose longitudinal direction is in the scanning signal line direction. A major portion of the semiconductor layer 214b is overlapped with the scanning signal line 202 and the thin section 209b.

An edge Eb4 corresponding to one short side (in the data signal line direction) of the thin section 209b is not overlapped with the semiconductor layer 214b, and is located outside an edge of the semiconductor layer 214b. An edge Eb3 corresponding to a portion of the convex section 206b of the thin section 209b is not overlapped with the semiconductor layer 214b, either, and is located outside the edge of the semiconductor layer 214b.

The source electrode 226 and the drain electrode 236b are arranged on the semiconductor layer 214 (in the same layer), and face each other with a given gap therebetween. The source electrode 226 is extended from the data signal line 203, and preferably has a rectangular or substantially rectangular shape whose longitudinal direction is in the scanning signal line direction (left-to-right direction in the figure). The source electrode 226 is located on the semiconductor layer 214b (overlapped with the semiconductor layer 214b), and its major portion is overlapped with the scanning signal line 202. The drain electrode 236b includes: an extending section 246b, which preferably has a rectangular or substantially rectangular shape whose longitudinal direction is in the scanning signal line direction (left-to-right direction in the figure); and a connection section 256b for connecting the extending section 246b to a drain lead electrode 207b. The connection section 256b extends from the extending section 246b away from the source electrode 226 (for example, perpendicular), and its width in the scanning signal line direction (that is, in the longitudinal direction of the extending section 246b) is narrower than a width of the extending section 246b in the scanning signal line direction. The drain electrode 236b is on the semiconductor layer 214b (overlapped with the semiconductor layer 214b), and its major portion is overlapped with the scanning signal line 202.

Each of the electrodes (226 and 236b) is arranged such that an overlapping area (TS overlapping area 219b) of the thin section 209b with the source electrode 226 is smaller than an overlapping area (TD overlapping area 229b) of the thin section 209b with the drain electrode 236b. To put it differently, when viewed perspectively, while a major portion of the extending section 246b in the drain electrode 236b (the extending section 246b and a part of the connection section 256b) is located inside an edge of the thin section 209b, only a portion of the source electrode 226 is located inside the edge of the thin section 209b.

Moreover, the connection section 256b in the drain electrode 236b is arranged so as to cross, in this order, an edge corresponding to one long side of the thin section 209b (a side where the convex section 206b is provided), an edge corresponding to one long side of the semiconductor layer 214b, and an edge corresponding to the other long side of the scanning signal line 202. The edges Eb3 and Eb4 are respectively disposed at each side of the connection section 256b when viewed in the scanning signal line direction.

Figure 5:
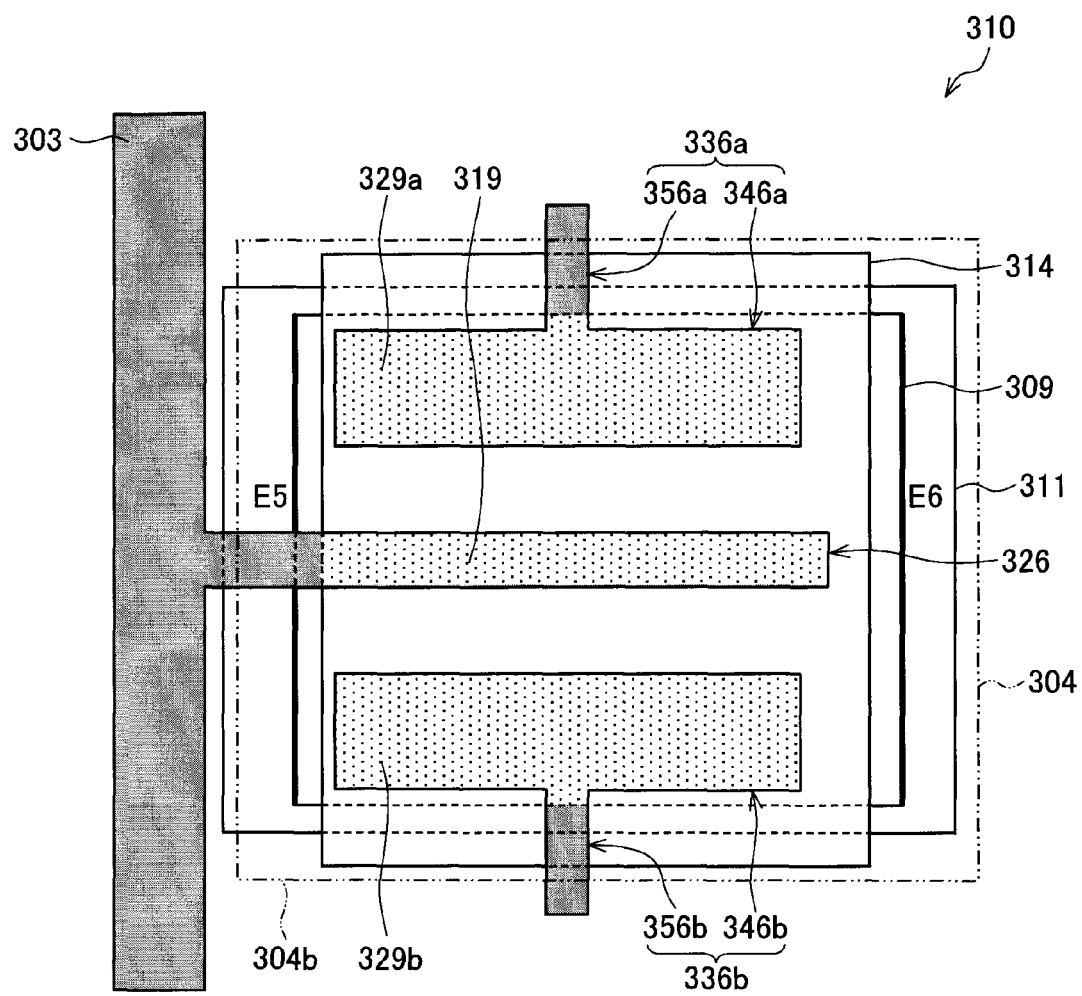
FIG. 5 is a plan view illustrating an exemplary arrangement of the active matrix substrate.

Furthermore, the active matrix substrate can be also modified to one in FIG. 5. FIG. 5 is a plan view illustrating an arrangement of an active matrix substrate of this preferred embodiment. As illustrated in the figure, an active matrix substrate 310 includes a pixel electrode (not illustrated) and a TFT (thin film transistor) 304. A scanning signal line (not illustrated) and a data signal line 303, which are perpendicular to each other, are provided around the pixel electrode, and the TFT 304 is provided in the vicinity of an intersection of the scanning signal line and the data signal line 303.

The TFT 304 includes a gate electrode 311, a source electrode 326, and first and second drain electrodes 336a and 336b. The source electrode 326 is connected to the data signal line 303. The first and second drain electrodes 336a and 336b are connected to each other and to one pixel electrode via a contact hole, as is not illustrated here. With such an arrangement, data (signal potential) from the data signal line 303 is input to one pixel electrode via the source electrode 326 and the first and second drain electrodes 336a and 336b in the TFT 304.

When viewed flatly, the gate electrode 311 preferably has a rectangular or substantially rectangular shape whose longitudinal direction is in a scanning signal line direction (left-to-right direction in the figure). In the active matrix substrate, a thin section (low-layer insulating film region) 309 whose film thickness is thinner than that of its periphery is provided in a gate insulating film covering the gate electrode 311. The gate insulating film includes a plurality of gate insulating layers, and at least one of the layers is partially removed or deposited to be thin so as to form the thin section 309. The thin section 309 is provided on the gate electrode 311 and overlapped therewith, and preferably has a rectangular or substantially rectangular shape whose longitudinal direction is in the scanning signal line direction. A preferably high-resistance semiconductor layer 314 is provided on the gate insulating film and preferably a rectangular or substantially rectangular shape whose longitudinal direction is in the scanning signal line. A major portion of the semiconductor layer 314 is overlapped with the gate electrode 311 and a thin section 309 (in the gate insulating film).

Edges E5 and E6 respectively corresponding to each of short sides of the thin section 309 (in a data signal line direction) are not overlapped with the semiconductor layer 314, and are located outside an edge of the semiconductor layer 314.

The source electrode 326 and the first and second drain electrodes 336a and 336b are provided on the semiconductor layer 314 in the same layer. The first and second drain electrodes 336a and 336b are respectively located at each side of the source electrode 326 so as to face each other (that is, such an arrangement is a line symmetry with respect to a symmetrical axis which is a line passing on the source electrode 326).

The source electrode 326 preferably has a rectangular or substantially rectangular shape whose longitudinal direction is in the scanning signal line direction (left-to-right direction in the figure). The source electrode 326 is on the semiconductor layer 314 (overlapped with the semiconductor layer 314), and its major portion is overlapped with the gate electrode 11.

The first drain electrode 336a includes: an extending section 346a, which preferably has a rectangular or substantially rectangular shape whose longitudinal direction is in the scanning signal line direction (left-to-right direction in the figure); and a connection section 356a arranged to connect the extending section 346a to a drain lead electrode (not illustrated). The connection section 356a extends from the extending section 346a away from the source electrode 326 (for example, perpendicularly), and its width in the scanning signal line direction (that is, in the longitudinal direction of the extending section 346a) is narrower than a width of the extending section 346 in the scanning signal line direction. The first drain electrode 336a is located on the semiconductor layer 314 (overlapped with the semiconductor layer 314), and its major portion is overlapped with the gate electrode 311.

The second drain electrode 336b includes: an extending section 346b, which preferably has a rectangular or substantially rectangular shape whose longitudinal direction is in the scanning signal line direction (left-to-right direction in the figure); and a connection section 356b arranged to connect the extending section 346 to an drain lead electrode (not illustrated). The connection section 356b extends from the extending section 346b away from the source electrode 326 (for example, perpendicularly), and its width in the scanning signal line direction (that is, in the longitudinal direction of the extending section 346b) is narrower than a width of the extending section 346b in the scanning signal line direction. The second drain electrode 326b is located on the semiconductor layer 314 (overlapped with the semiconductor layer 314), and its major portion is overlapped with the gate electrode 311.

Each of the electrodes (326, 336a, and 336b) is arranged such that an overlapping area (TS overlapping area 319) of the thin section 309 with the source electrode 326 is smaller than an amount of (i) an overlapping area (TD overlapping area 329a) of the thin section 309 with the first drain electrode 336a and (ii) an overlapping area (TD overlapping area 329b) of the thin section 309 with the second drain electrode 336b.

Moreover, the connection section 356a in the first drain electrode 336a is arranged so as to cross, in this order, an edge corresponding to one long side of the thin section 309, an edge corresponding to one long side of the semiconductor layer 314, and an edge corresponding to one long side of the gate electrode 311. Meanwhile, the connection section 356b in the second drain electrode 336b is arranged so as to cross, in this order, an edge corresponding to the other long side of the thin section 309, an edge corresponding to the other long side of the semiconductor layer 314, and an edge corresponding to the other long side of the gate electrode 311. The edges E5 and E6 of the thin section 309 are respectively disposed at each side of the connection sections 356a and 356b when viewed in the scanning signal line direction.

Figure 9:
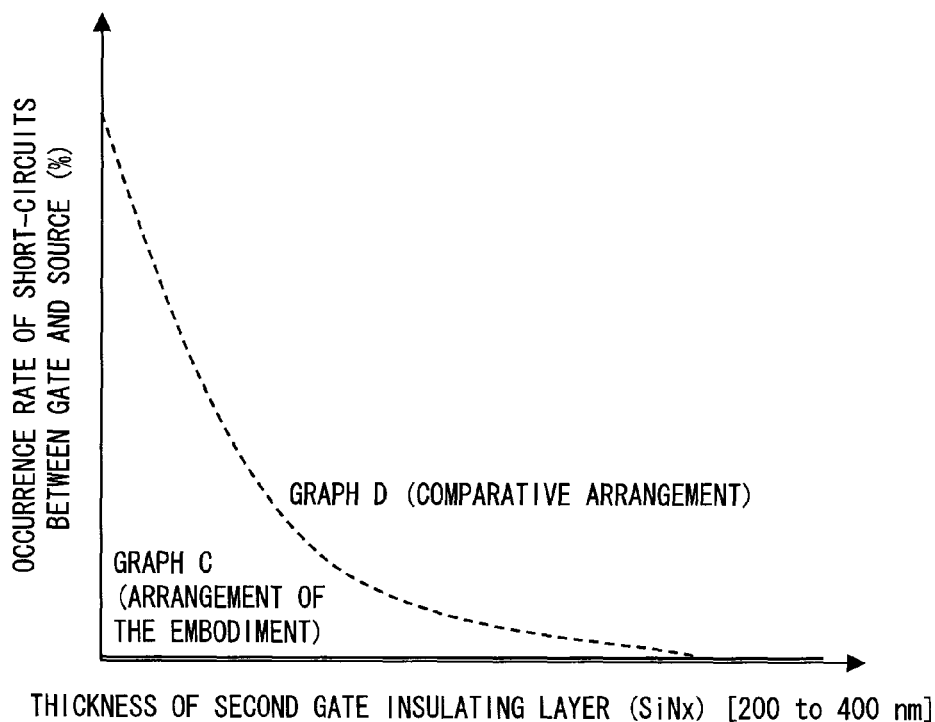
FIG. 9 is a graph illustrating an effect for preventing a SG leak in the active matrix substrate.
Figure 12:
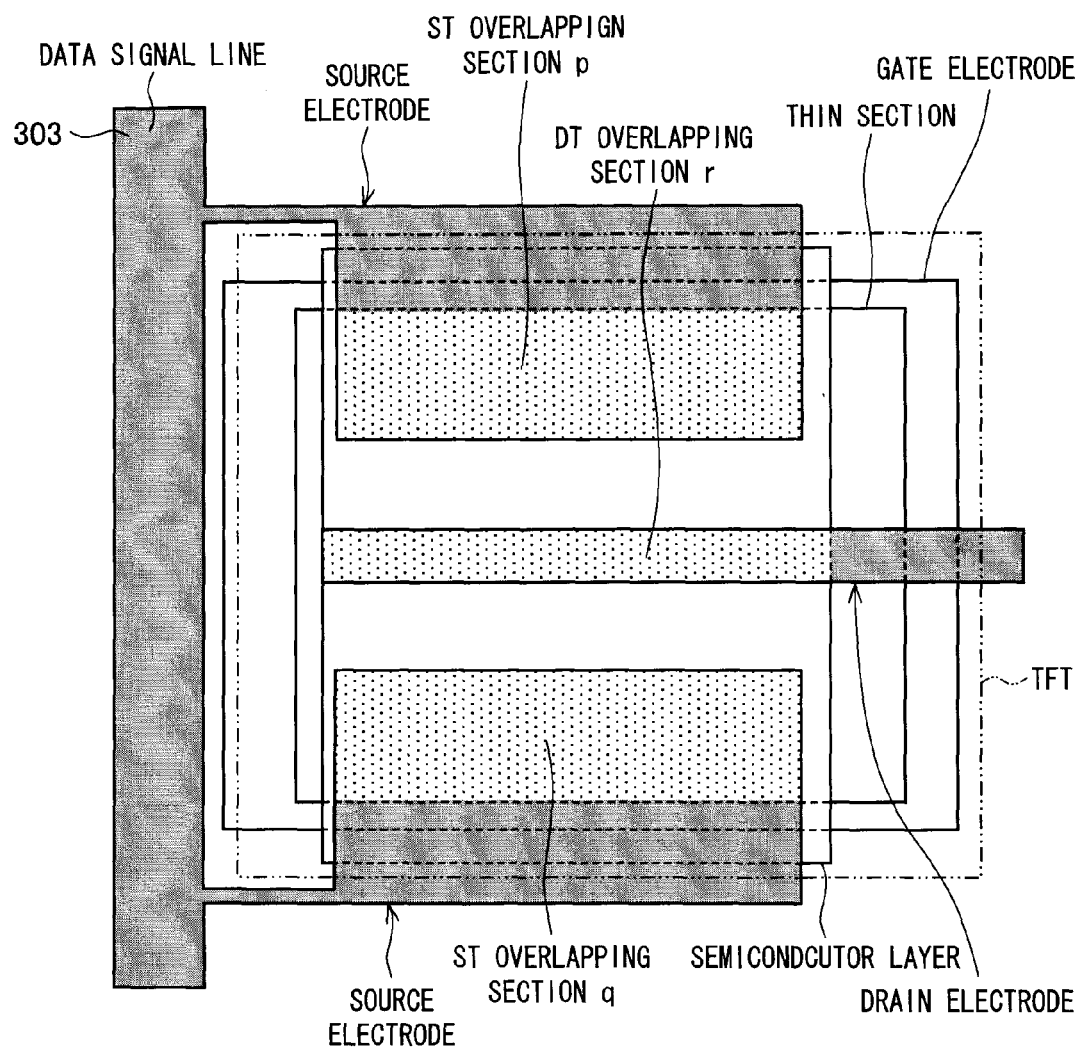
FIG. 12 is a plan view illustrating a comparative exemplary arrangement for explanation of an effect of the active matrix substrate.

Here, FIG. 9 illustrates occurrence rates of a SG leak in an arrangement of FIG. 7, which is based on the active matrix substrate 310, and in a comparative arrangement of FIG. 12. In the arrangement of FIG. 7, an area of a DT (drain and thin section) overlapping section P: an area of a ST (source and thin section) overlapping section R: an area of a DT (drain and thin section) overlapping section Q is 2:1:2. Meanwhile, in the comparative arrangement of FIG. 12, an area of a ST (source and thin section) overlapping section p: an area of a DT (drain and thin section) overlapping section r: an area of an ST (source and thin section) overlapping section q is 2:1:2. The area of P is equal to the area of p, the area of Q is equal to the area of q, and the area of R is equal to the area of r. It is shown from FIG. 9 that the SG leak occurrence rate is drastically reduced in the arrangement of FIG. 7 (a graph C) compared with the comparative arrangement of FIG. 12 (a graph D).

Figure 13:
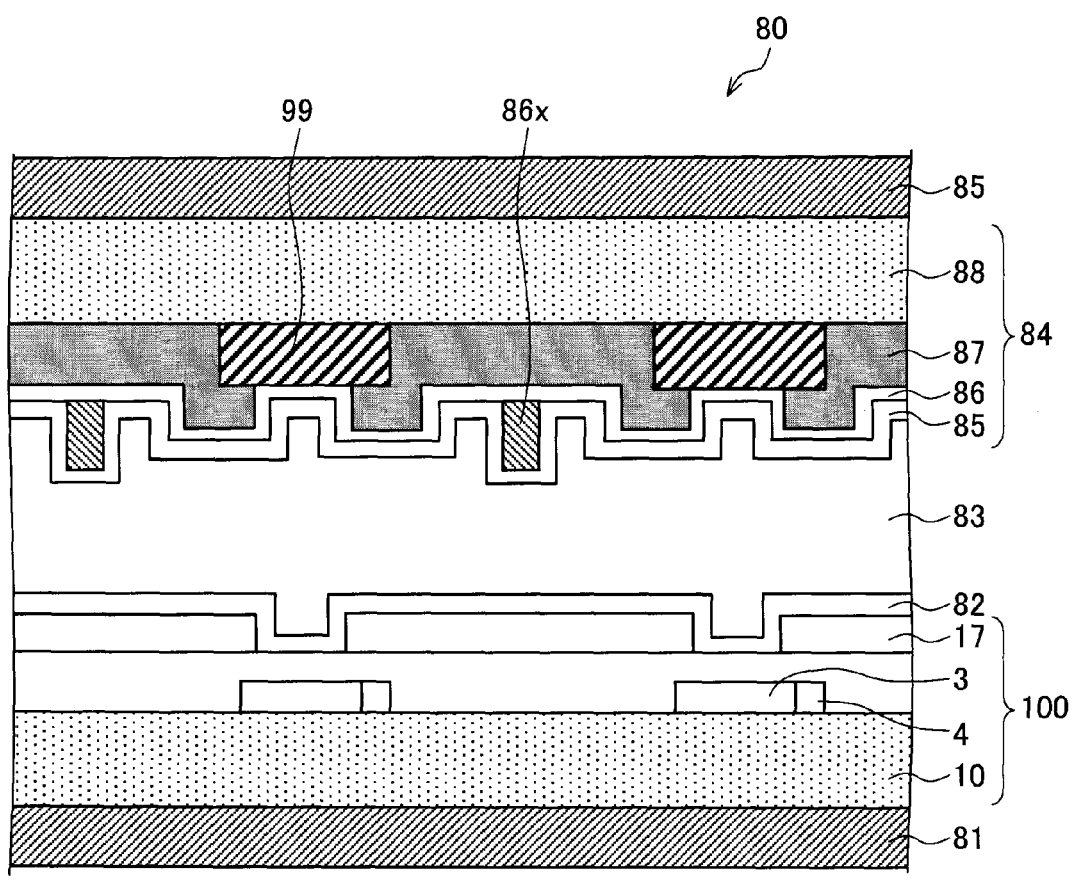
FIG. 13 is a cross sectional view illustrating an arrangement of a liquid crystal panel according to a preferred embodiment of the present invention.

FIG. 13 illustrates an arrangement in which the active matrix substrate is used in a liquid crystal panel. As illustrated in the figure, a liquid crystal panel 80 includes, in this order from a backlight light source side, a polarizing plate 81, the active matrix substrate 100 (110, 210, or 310), an alignment film 82, a liquid crystal layer 83, a color filter substrate 84, and a polarizing plate 85. The color filter substrate 84 includes, in this order from the liquid crystal layer 83, an alignment film 85, a common (counter) electrode 86, a coloring layer 87 (including a black matrix 99), and a glass substrate 88. A liquid crystal molecule alignment control projection (rib) 86x is provided in the common (counter) electrode 86. The liquid crystal molecule alignment control projection 86x is, for example, made of a photosensitive resin, or the like. A planar shape of the rib 86x (viewed from a direction perpendicular to a substrate) is, for example, a band shape which is bended in zigzags at a constant interval (laterally-facing V-shape).

Here, explained is a method for injecting a liquid crystal between an active matrix substrate and a color filter substrate in producing a liquid crystal panel. A liquid crystal injecting method may be carried out, for example, by a vacuum-injection method in which (i) a filling opening for injecting a liquid crystal is provided on a periphery of a substrate, (ii) the filling opening is immersed in liquid crystal in vacuum and then released in the air so that the liquid crystal is injected, and (iii) the filling opening is sealed with a UV cure resin or the like. However, since an injecting time becomes quite longer in a vertical alignment liquid crystal panel than in a horizontal alignment panel, it is preferable that the following bonding method by dropping liquid crystal be used. First of all, a UV cure sealing resin is applied to a periphery of an active matrix substrate and a liquid crystal is dropped onto a color filter substrate by a dropping method. According to such a liquid crystal dropping method, an appropriate amount of liquid crystal is regularly dropped inside the seal, so as to obtain a desired cell gap. Then, in order to bond the color filter substrate to which seal plotting and liquid crystal dropping are performed, and the active matrix substrate, a pressure inside a bonding apparatus is reduced to about 1 Pa, for example, and the substrates are bonded under the pressure. Then, the pressure is increased to the atmospheric pressure so as to crush the seal section, thereby resulting in that a desired cell gap is obtained. After the sealing resin is half cured by UV irradiation, a baking is carried out for completely curing the sealing resin. At this point, the liquid crystal fills all over inside the sealing resin in the cell. After the baking is completed, segmentation to a panel unit is performed, and a polarizing plate is bonded thereto. In this way, a liquid crystal panel illustrated in FIG. 13 is obtained.

The following describes a liquid crystal display device of this preferred embodiment.

Figure 14:
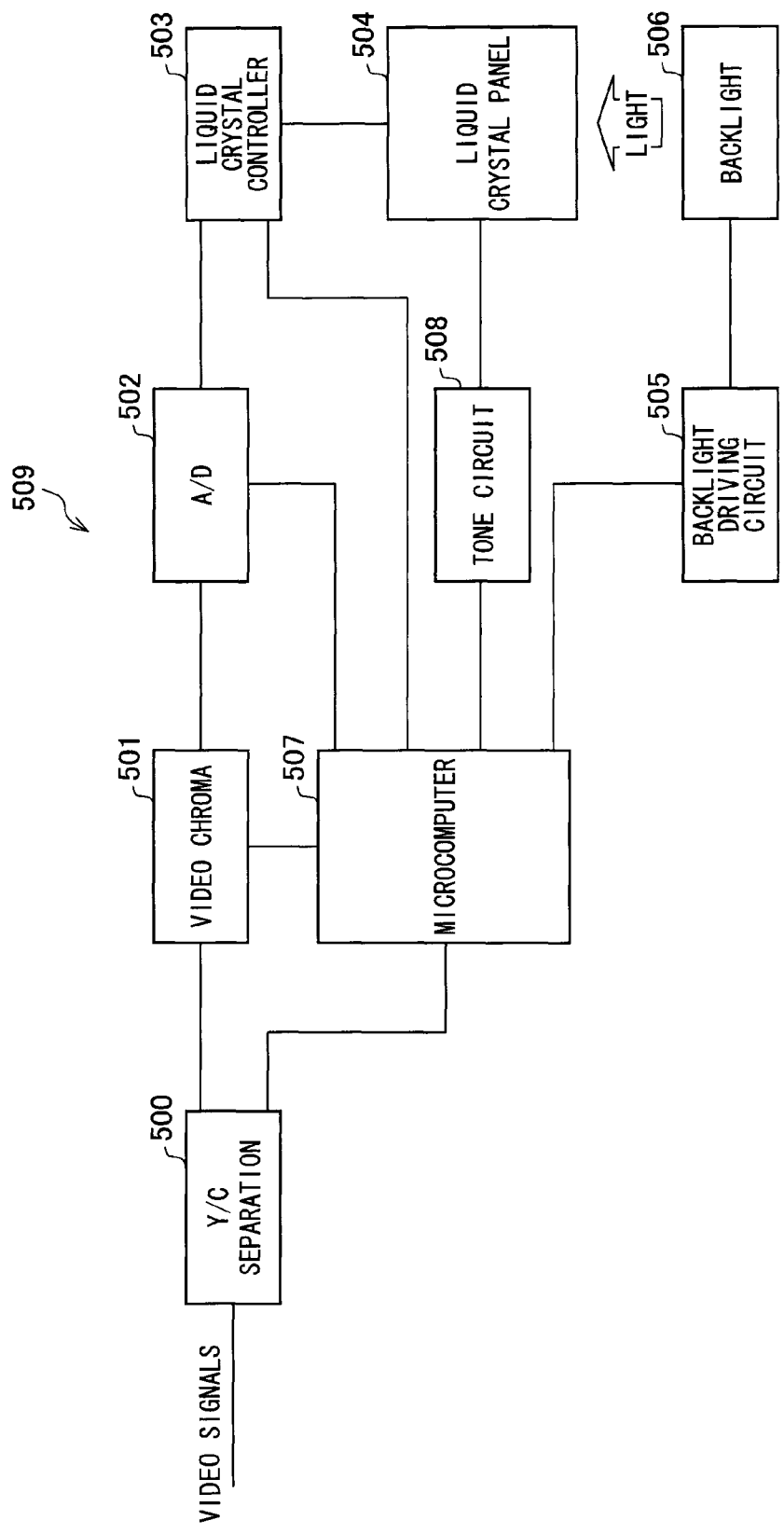
FIG. 14 is a block view illustrating a control system in a liquid crystal panel according to a preferred embodiment of the present invention.

FIG. 14 is a block diagram schematically illustrating an arrangement of a liquid crystal display device 509. As illustrated in FIG. 14, a liquid crystal display device 509 includes a Y/C separation circuits 500, a video chroma circuit 501, an A/D converter 502, a liquid crystal controller 503, a liquid crystal panel 504 including the active matrix substrate according to a preferred embodiment of the present invention, a backlight driving circuit 505, a backlight 506, a microcomputer 507, and a tone circuit 508.

An image signal and a video signal displayed in the liquid crystal display device 509 (hereinafter referred to as "video signals") are input in the Y/C separation circuit 500, and separated into a brightness signal and a color signal. These brightness signal and color signal are converted into analog RGB signals corresponding to light's three primary colors R, G, and B at the video chroma circuit 501. Moreover, these analog RGB signals are converted into digital RGB signals at the A/D converter 502, and are then input in the liquid crystal controller 503.

The digital RGB signals input in the liquid crystal controller 503 are supplied from the liquid crystal controller 503 to the liquid crystal panel 504. While the digital RGB signals are input in the liquid crystal panel 504 from the liquid crystal controller 503 at a specified timing, tone voltages corresponding to each of the RGB are supplied to the liquid crystal panel 504 from the tone circuit 508. The backlight 506 is driven by the backlight driving circuit 505, so as to irradiate light to the liquid crystal panel 504. Thereby, picture image or video image is displayed in the liquid crystal panel 504. The whole liquid crystal display device 509 is controlled by the microcomputer 507.

The video signals encompass various video signals such as video signals based on television broadcast, video signals captured by a camera, video signals supplied via an internet line.

Figure 15:
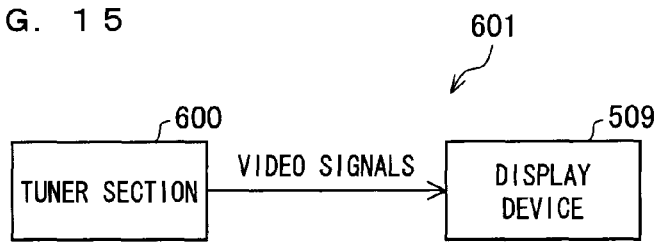
FIG. 15 is a block view illustrating an arrangement of a television receiver according to a preferred embodiment of the present invention.

If the liquid crystal display device 509 according to a preferred embodiment of the present invention is connected to a tuner section 600 which receives a television broadcast and outputs its video signals, as illustrated in FIG. 15, then the liquid crystal display device 509 can display image (picture) based on the video signals output from the tuner section 600. In this case, the liquid crystal display device 509 and the tuner section 600 constitute a television receiver 601.

Figure 16:
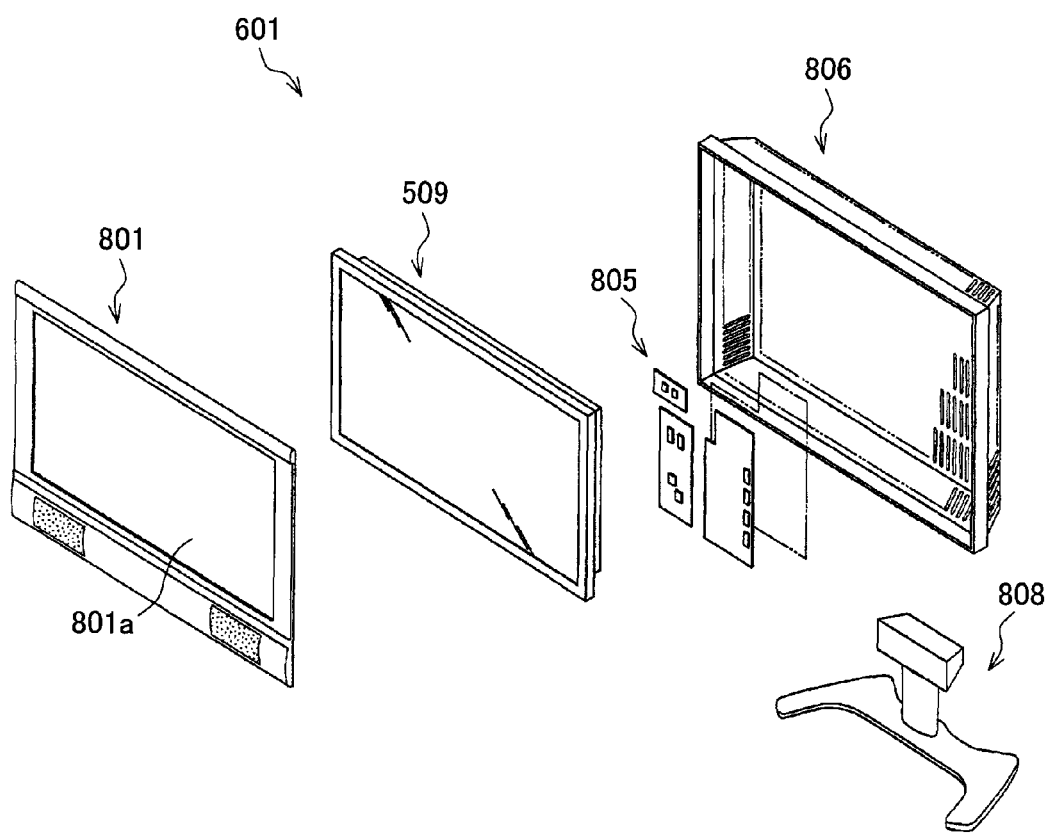
FIG. 16 is a perspective view illustrating an arrangement of a television receiver according to a preferred embodiment of the present invention.
Figure 17:
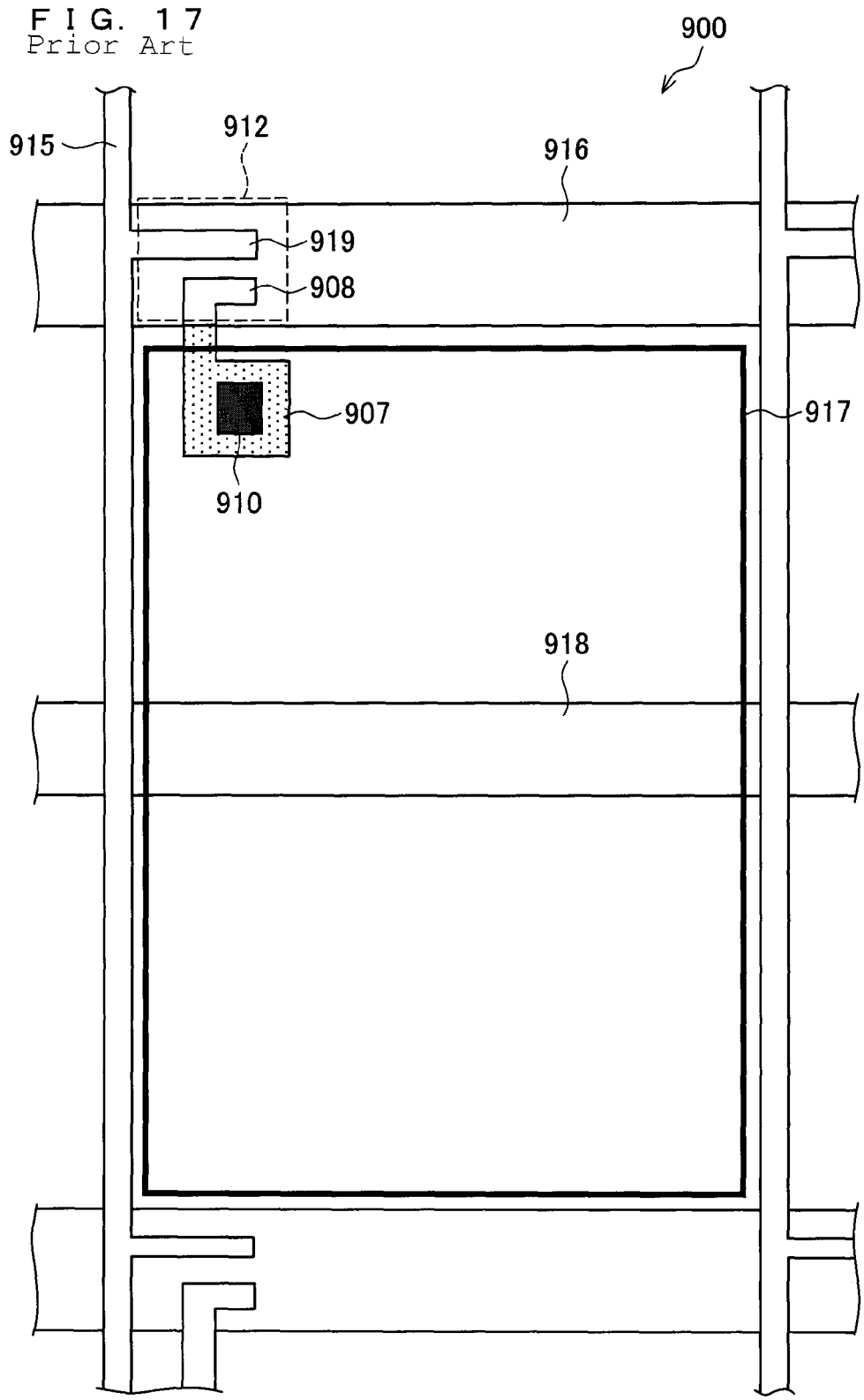
FIG. 17 is a plan view illustrating an arrangement of a conventional active matrix substrate.

When the liquid crystal display device constitutes the television receiver 601, for example, as illustrated in FIG. 16, the liquid crystal display device 509 is arranged so as to be sandwiched between a first case 801 and a second case 806. In the first case 801, an opening section 801a is arranged so that image to be displayed in the liquid crystal display device 509 passes therethrough. The second case 806, which covers a backside of the liquid crystal display device 509, includes: an operation circuit 805 for operating the liquid crystal display device 509; and a supporting member 808 attached on a bottom of the second case 806.

Although a preferred embodiment of the present invention is applicable to the liquid crystal display illustrated in FIG. 14 as a display device, the present invention is also applicable to other display devices such as an organic EL display device.

Various preferred embodiments of the present invention can be applied to not only a liquid crystal display device, but also can be applied to an organic EL display device, for example, such that (i) a color filter substrate and an active matrix substrate according to a preferred embodiment of the present invention are arranged so as to face each other, (ii) an organic EL layer is provided between those substrates so as to be an organic EL panel, and (iii) an external lead terminal of the panel is connected to a driver or the like. Furthermore, other than such a liquid crystal display device and an organic EL display device, the active matrix substrate according to a preferred embodiment of the present invention can be applied to any display device which includes an active matrix substrate.

The active matrix substrate according to various preferred embodiments of the present invention is preferably applied, for example, to a liquid crystal television.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An active matrix substrate comprising:
a plurality of transistors each including a source electrode connected to a data signal line, and a drain electrode connected to a pixel electrode; wherein
the source electrode is located on a semiconductor layer, at least a portion of the source electrode is overlapped with a gate electrode;
the drain electrode is located on the semiconductor layer, at least a portion of the drain electrode is overlapped with the gate electrode;
a gate insulating film covering the gate electrodes of each transistor includes a thin section having a reduced film thickness at each portion which is overlapped with each gate electrode; and
an overlapping area of the thin section with the source electrode is smaller than an overlapping area of the thin section with the drain electrode.

2. The active matrix substrate as set forth in claim 1, wherein the gate insulating film includes a plurality of gate insulating layers, wherein the thin section includes at least one of the gate insulating layers, and a portion other than the thin section includes more gate insulating layers than the thin section.

3. The active matrix substrate as set forth in claim 2, wherein at least one of the gate insulating layers is a planarizing film.

4. The active matrix substrate as set forth in claim 2, wherein in the portion other than the thin section, a bottom one of the gate insulating layers is a planarizing film.

5. The active matrix substrate as set forth in claim 4, wherein a portion of the planarizing film that comes into contact with a surface of the substrate is thicker than the gate electrode provided on the surface of the substrate.

6. The active matrix substrate as set forth in claim 2, wherein, a spin on glass film made of a spin on glass material is provided as a bottom one of the gate insulating layers in the portion other than the thin section, and the spin on glass film is not provided in the thin section.

7. The active matrix substrate as set forth in claim 1, wherein the gate insulating film has such a shape that, a portion thereof adjacent to edges of the thin section has a forward tapered shape.

8. The active matrix substrate as set forth in claim 1, wherein:
the thin section has a linear edge;

the drain electrode includes an extending section extending toward a direction of the linear edge and a connection section extending from the extending section away from the source electrode;

the extending section is located on the thin section, the connection section is overlapped with the edge, and a width of the connection section in the direction of the edge is narrower than a width of the extending section in the edge direction.

9. The active matrix substrate as set forth in claim 1, wherein a portion of the edge of the thin section is located outside an outer circumference of the semiconductor layer.

10. The active matrix substrate as set forth in claim 1, wherein the drain electrode includes first and second drain electrodes respectively provided at each side of the source electrode.

11. An active matrix substrate comprising: first and second transistors, and first and second pixel electrodes in each pixel region, the first and the second transistors including: a source electrode in common, the source electrode being connected to a data signal line; the first transistor including a first gate electrode and a first drain electrode; the second transistor including a second gate electrode and a second drain electrode; the first and second gate electrodes being a portion of a scanning signal line or being extended from the scanning signal line; the first drain electrode being connected to the first pixel electrode and the second drain electrode is connected to the second pixel electrode; the source electrode being located on a semiconductor layer, and at least a portion of the source electrode being overlapped with the first and second gate electrodes; the first drain electrode being located on the semiconductor layer, and at least a portion of the first drain electrode being overlapped with the first gate electrode; the second drain electrode being located on the semiconductor layer, and at least a portion of the second drain electrode being overlapped with the second gate electrode; a gate insulating film covering each of the gate electrodes and including a first thin section having a reduced film thickness at a portion which is overlapped with the first gate electrode, and a second thin section having a reduced film thickness at a portion which is overlapped with the second gate electrode; each of the thin sections being arranged such that an overlapping area of the first thin section with the source electrode is smaller than an overlapping area of the first thin section with the first drain electrode, and an overlapping area of the second thin section with the source electrode is smaller than an overlapping area of the second thin section with the second drain electrode.

12. The active matrix substrate as set forth in claim 11, wherein the source electrode includes first and second source electrodes, and an overlapping area of the first thin section with the first source electrode is smaller than the overlapping area of the first thin section with the first drain electrode, and an overlapping area of the second thin section with the second source electrode is smaller than the overlapping area of the second thin section with the second drain electrode.

13. The active matrix substrate as set forth in claim 11, wherein a hollow section where no electrode is provided is provided in the scanning signal line at an intersection thereof with the data signal line.

14. The active matrix substrate as set forth in claim 13, wherein the hollow section extends in a scanning signal line direction, and the first and second gate electrode are respectively located at each side thereof.

15. The active matrix substrate as set forth in claim 2, comprising a gate insulating layer including an organic material.

16. An active matrix substrate comprising: a plurality of transistors, each of which includes: a source electrode connected to a data signal line; a drain electrode connected to a pixel electrode; and a gate electrode, which is connected to a scanning signal line, or alternatively is the scanning signal line being used as a gate electrode; and a gate insulating film covering the gate electrode of each of the transistors and including a thin section having a reduced film thickness at each portion which is overlapped with each of the gate electrodes; the thin section being arranged such that its overlapping area with the source electrode is smaller than its overlapping area with the drain electrode.

17. A display device comprising an active matrix substrate according to claim 1.

18. A television receiver comprising a display device as set forth in claim 17, and a tuner section arranged to receive a television broadcast.

19. A display device comprising an active matrix substrate according to claim 11.

20. A television receiver comprising a display device as set forth in claim 19, and a tuner section arranged to receive a television broadcast.

21. A display device comprising an active matrix substrate according to claim 16.

22. A television receiver comprising a display device as set forth in claim 21, and a tuner section arranged to receive a television broadcast.

* * * * *